United States Patent
Ito et al.

(10) Patent No.: US 10,644,234 B2
(45) Date of Patent: May 5, 2020

(54) METHOD FOR PRODUCING MAGNETIC MEMORY COMPRISING MAGNETIC TUNNEL JUNCTION ELEMENT

(71) Applicant: Tohoku University, Sendai-shi, Miyagi (JP)

(72) Inventors: Kenchi Ito, Miyagi (JP); Tetsuo Endoh, Miyagi (JP); Shoji Ikeda, Miyagi (JP); Hideo Sato, Miyagi (JP); Hideo Ohno, Miyagi (JP); Sadahiko Miura, Miyagi (JP); Masaaki Niwa, Miyagi (JP); Hiroaki Honjo, Miyagi (JP)

(73) Assignee: TOHOKU UNIVERSITY, Sendai-shi, Miyagi (JP)

( * ) Notice: Subject to any disclaimer, the term of this patent is extended or adjusted under 35 U.S.C. 154(b) by 0 days.

(21) Appl. No.: 16/329,717

(22) PCT Filed: Aug. 28, 2017

(86) PCT No.: PCT/JP2017/030682
§ 371 (c)(1),
(2) Date: Feb. 28, 2019

(87) PCT Pub. No.: WO2018/043377
PCT Pub. Date: Mar. 8, 2018

(65) Prior Publication Data
US 2019/0198755 A1 Jun. 27, 2019

(30) Foreign Application Priority Data
Aug. 31, 2016 (JP) ................. 2016-170032

(51) Int. Cl.
*H01L 43/12* (2006.01)
*H01L 21/8239* (2006.01)
*H01L 27/22* (2006.01)

(52) U.S. Cl.
CPC .......... *H01L 43/12* (2013.01); *H01L 21/8239* (2013.01); *H01L 27/228* (2013.01)

(58) Field of Classification Search
None
See application file for complete search history.

(56) References Cited

U.S. PATENT DOCUMENTS

| 6,322,640 | B1 * | 11/2001 | Xiao | B82Y 25/00 |
| | | | | 148/308 |
| 2009/0246890 | A1 * | 10/2009 | Gill | B82Y 10/00 |
| | | | | 438/3 |

(Continued)

FOREIGN PATENT DOCUMENTS

| JP | 2009253303 A | 10/2009 |
| JP | 2009295737 A | 12/2009 |

(Continued)

OTHER PUBLICATIONS

International Search Reporting and Written Opinion for related PCT App No. PCT/JP2017/030682 dated Nov. 14, 2017, 14 pgs.

(Continued)

*Primary Examiner* — Nilufa Rahim
(74) *Attorney, Agent, or Firm* — Procopio, Cory, Hargreaves & Savitch LLP

(57) ABSTRACT

A method for producing a magnetic memory includes: forming a magnetic film having a non-magnetic layer between a first magnetic layer and a second magnetic layer on a substrate having an electrode layer; performing annealing treatment at a first treatment temperature in a state where a magnetic field is applied in a direction perpendicular to a film surface of the first or the second magnetic layer in vacuum; forming a magnetic tunnel junction element; forming a protective film protecting the magnetic tunnel junction element; a formation accompanied by thermal history, in which a constituent element of a magnetic memory is (Continued)

formed after the protective film formation on the substrate; and implementing annealing treatment at a second treatment temperature lower than the first treatment temperature on the substrate in an annealing treatment chamber, in vacuum or inert gas wherein no magnetic field is applied.

16 Claims, 17 Drawing Sheets

(56) References Cited

U.S. PATENT DOCUMENTS

| | | |
|---|---|---|
| 2009/0256220 A1 | 10/2009 | Horng et al. |
| 2009/0302404 A1 | 12/2009 | Matsuda et al. |
| 2011/0018531 A1 | 1/2011 | Ishizaki |
| 2011/0233700 A1 | 9/2011 | Hayakawa et al. |
| 2011/0280064 A1 | 11/2011 | Noshiro |
| 2013/0216702 A1* | 8/2013 | Kaiser .................. H01L 43/12 427/127 |

FOREIGN PATENT DOCUMENTS

| | | |
|---|---|---|
| JP | 2011027495 A | 2/2011 |
| JP | 2014112691 A | 6/2014 |
| WO | 2010067520 A1 | 6/2010 |
| WO | 2010103649 A1 | 9/2010 |
| WO | 2010125941 A1 | 11/2010 |

OTHER PUBLICATIONS

Brown, Jr., W.F., Thermal Fluctuations of a Single-Domain Particle, Physical Review, 130(5), 1963, pp. 1677-1686.

Takemura, R., et al., A 32-Mb SPRAM With 2T1R Memory Cell, Localized Bi-Directional Write Driver and '1'/'0' Dual-Array Equalized Reference Scheme, IEEE Journal of Solid-State Circuits, 45(4), Apr. 2010, pp. 869-879.

* cited by examiner

METHOD FOR PRODUCING MAGNETIC MEMORY COMPRISING MAGNETIC TUNNEL JUNCTION ELEMENT

CROSS-REFERENCE TO RELATED APPLICATIONS

This application is a U.S. National Stage entry of PCT Application No: PCT/JP2017/030682 filed Aug. 28, 2017, which claims priority to Japanese Patent Application No. 2016-170032, filed Aug. 31, 2016, the contents of which are incorporated herein by reference.

TECHNICAL FIELD

The present invention relates to a method for producing magnetic memory comprising a magnetic tunnel junction element.

BACKGROUND ART

A non-volatile memory such as MRAM using a magnetoresistance effect element is known (for example, see PTL 1). A magnetoresistance effect element can be exemplified by a magnetic tunnel junction element (MTJ element) in which a barrier layer 112 (nonmagnetic barrier layer) is disposed between a reference layer 111 and a recording layer 113 which are magnetic layers as shown in FIG. 16. In the example shown in FIG. 16, the reference layer 111, in which the direction of magnetization hardly changes, is magnetized in the direction perpendicular to the layer surface (film surface). The magnetization direction of the recording layer 113 is variable. The saturation magnetization $M_s$ of the recording layer 113 is defined by the material, structure, temperature, and the like of the recording layer 113. The magnetoresistance effect element shown in FIG. 16 is a so-called "perpendicular anisotropy MTJ element". When the magnetization direction of the recording layer 113 is parallel to the magnetization of the reference layer 111, the electrical resistance of the MTJ element decreases, and when the magnetization direction of the recording layer is antiparallel to the magnetization of the reference layer, the electrical resistance of the MTJ element increases. The MTJ element has a structure in which information can be recorded by associating the two states of resistance with "0" and "1" of bit information, respectively.

As shown in FIGS. 16 and 17(a), an energy barrier $E_b$ of the recording layer 113 can be expressed by an Equation (1) by using an angle $\theta$ formed by the magnetization direction of the recording layer 113 and the magnetization direction of the reference layer 111, a magnetic anisotropic energy density $K_{eff}$ of the reference layer 111, and a volume V of the recording layer 113. When $\sin^2 \theta = 1$ ($\theta = 90°, 270°$), this energy becomes the energy barrier ($E_b$) required for magnetization reversal.

$$E_b = K_{eff} V \sin^2 \theta \tag{1}$$

For a non-volatile memory such as a MRAM having a magnetoresistance effect element (MTJ element), a thermal stability index is an indicator of stability of bit information. This thermal stability index $\Delta_0$ is expressed by an Equation (2) using a Boltzmann constant $k_B$ and an absolute temperature T.

$$\Delta_0 = E_b/(k_B T) \tag{2}$$

The probability P that a recording layer having a thermal stability index $\Delta_0$ will demonstrate magnetization reversal after a time t is expressed by an Equation (3) according to a Neel-Arrhenius law (for example, see NPL 1). As shown in FIG. 17(b), the time t when the probability P is 50% corresponds to the retention time of information by the recording layer 113.

$$P = 1 - \exp\{(-t/10^{-9}) \times \exp(-\Delta_0)\} \tag{3}$$

A magnetic field pulse method, a current pulse method, and the like are known as general methods for measuring the thermal stability index $\Delta_0$. In the magnetic field pulse method, the magnetization reversal probability when a magnetic field pulse of a specific pulse width is applied is measured while changing the magnitude of the magnetic field of the magnetic field pulse, and the thermal stability index $\Delta_0$ is obtained based on the relationship between the magnitude of the magnetic field and the magnetization reversal probability.

In the current pulse method, the magnetization reversal probability when a current pulse of a specific pulse width is applied is measured while changing the magnitude of the current of the current pulse, and the thermal stability index $\Delta_0$ is obtained based on the relationship between the magnitude of the current and the magnetization reversal probability.

A measurement means for measuring the thermal stability index $\Delta_0$, which is different from the magnetic field pulse method and current pulse method, is known in which an MRAM chip including MTJs of 10 Mb or more is prepared, 1 or 0 information is written in a checkerboard pattern or the like in the recording layer of each MTJ, the chip is allowed to stand at high temperature for several minutes to 100 hours, an error rate indicating how much initial information has been lost is measured, and the thermal stability index $\Delta_0$ is obtained based on the relationship between the reversal probability calculated from the error rate and the standing time. According to this method, since the value of the energy barrier does not change during measurement, an accurate thermal stability index $\Delta_0$ can be obtained regardless of the mode of magnetization reversal.

For example, a method for producing a magnetic memory using a magnetoresistance effect element is known, in which a complementary mental oxide semiconductor (CMOS) is formed in a wafer serving as a substrate, an intermediate wiring for connecting to an MTJ on the CMOS is formed, a magnetic film is wired to the upper portion of the intermediate wiring, the magnetic film is subjected to heat treatment in a magnetic field, an MTJ pattern is thereafter prepared, an MTJ is formed by etching process, a protective film is formed, an upper wiring is formed on the MTJ, the configuration is cut into a chip shape and connected to a predetermined circuit substrate by a wire bonding metal wire, and then resin sealing is performed.

CITATION LIST

Patent Literature

[PTL 1] Japanese Patent Application Publication No. 2014-112691
[PTL 2] Japanese Patent Application Publication No. 2011-27495

Non Patent Literature

[NPL 1] W F. Brown, Jr., "Thermal Fluctuations of a Single-Domain Particle", Phys. Rev., 1963, Vol. 130, Num. 5, p. 1677-1686

SUMMARY OF INVENTION

Problem to be Solved by the Invention

However, in the above-described method for producing a magnetic memory, various types of thermal history are applied to the MTJ element and the like in a step of forming the protective film and the wiring, a resin sealing step, and the like after forming the magnetic film, stress and strain are generated in the MTJ element and surrounding constituent elements, and the performance of the MTJ element, such as the thermal stability index, may degrade due to the stress and strain.

Further, PTL 2 discloses a method for producing a magnetic sensor through a sequence of steps of forming a magnetic detection element assembled in a bridge shape on a substrate, forming a protective film that protects the magnetic detection element on the substrate so as to form the substrate as a multilayer substrate, forming a stress relaxation groove in the protective film by etching the protective film in the vicinity of the magnetic detection element, and packaging the multilayer substrate after forming the stress relaxation groove, wherein the multilayer substrate is annealed before packaging the multilayer substrate.

However, in the method for producing a magnetic sensor disclosed in PTL 2, it is necessary to perform a complicated step of forming the stress relaxation groove. As described in PTL 2, when annealing is performed before packaging, the stress remaining after packaging cannot be removed.

Means for Solving the Problem

A method for producing a magnetic memory comprising a magnetic tunnel junction element (magnetoresistance effect element) of the present invention has at least the following configuration.

A method for producing a magnetic memory comprising a magnetic tunnel junction element (magnetoresistance effect element), the method including:

a step of forming a magnetic film having a non-magnetic layer between a first magnetic layer and a second magnetic layer on a substrate provided with an electrode layer;

a magnetic-field annealing treatment step of performing annealing treatment on the substrate at a first treatment temperature in a state where a magnetic field is applied in a direction perpendicular to a film surface of the first magnetic layer or the second magnetic layer in vacuum;

a step of performing etching treatment on the magnetic film formed on the substrate to form a magnetic tunnel junction element having a predetermined pattern;

a protective film formation step of forming a protective film protecting the magnetic tunnel junction element formed on the substrate;

a formation step accompanied by thermal history, in which a constituent element of a magnetic memory is formed after the protective film formation step on the substrate on which the protective film has been formed; and a non-magnetic-field annealing treatment step of implementing annealing treatment at a second treatment temperature lower than the first treatment temperature on the substrate in an annealing treatment chamber, in vacuum or inert gas, in a state in which no magnetic field is applied.

Effects of the Invention

With the method for producing a magnetic memory using a magnetic tunnel junction element according to the present invention, a magnetic memory having a magnetic tunnel junction element having high element performance (thermal stability index, and the like) can be easily produced.

BRIEF DESCRIPTION OF DRAWINGS

FIG. 4(*a*) is a view for explaining a magnetic film formation step, FIG. 4(*b*) is a view for explaining a magnetic-field annealing treatment (magnetic-field heat treatment), and FIG. 4(*c*) is a view for explaining a step of forming a resist pattern for MTJ patterning.

FIG. 5(*a*) is a view for explaining patterning of MTJ, FIG. 5(*b*) is a view for explaining a formation step of forming an encapsulation film (protective film), and FIG. 5(*c*) is a view for explaining lower electrode formation (patterning).

FIG. 17 is a view for explaining the recording layer of the MTJ element, where

DESCRIPTION OF EMBODIMENTS

Figure 1A:
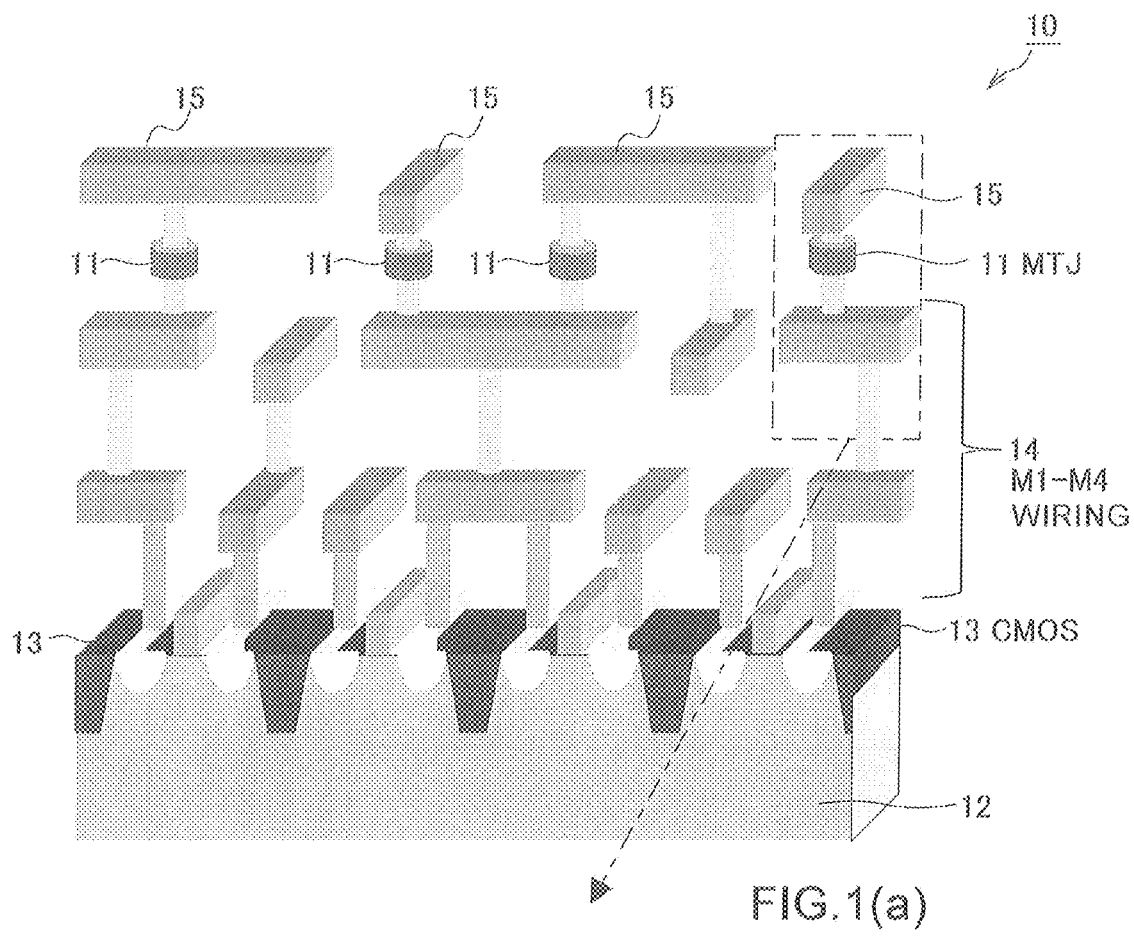
FIG. 1 is a diagram for explaining a magnetic memory (semiconductor integrated circuit) using a magnetic tunnel junction element according to an embodiment of the present invention, where FIG. 1(*a*) is a perspective view showing an example of the magnetic memory (semiconductor integrated circuit), and FIG. 1(*b*) is a partially enlarged view of a part of the magnetic memory (semiconductor integrated circuit).

In the method for producing a magnetic memory using a magnetoresistance effect element (magnetic tunnel junction element (MTJ element)) according to an embodiment of the present invention, a magnetic film of an MTJ element is formed on a substrate, magnetic-field heat treatment is implemented on the substrate at a first treatment temperature Ta, and then, after at least any one or more steps among the steps following the magnetic-field heat treatment, namely, a formation step of forming a protective film (encapsulation film) such as SiN that protects the MTJ element, a second interlayer film formation step, an upper wiring formation step, and a packaging step, annealing treatment is implemented on the substrate in an annealing treatment chamber (heat treatment chamber), in a state in which no magnetic field is applied, in vacuum or inert gas atmosphere, at a second treatment temperature Tb to relieve stress and strain in the protective film (encapsulation film) and the MTJ element. The second treatment temperature Tb is set to be lower than the first treatment temperature Ta.

Hereinafter, embodiments of the present invention will be described with reference to the drawings. Embodiments of the present invention include the contents shown in the drawings, but the present invention is not limited thereto. In the following explanation of the drawings, the same reference numerals are assigned to the parts that are common with the already described parts, and redundant explanation will be omitted.

Figure 1B:
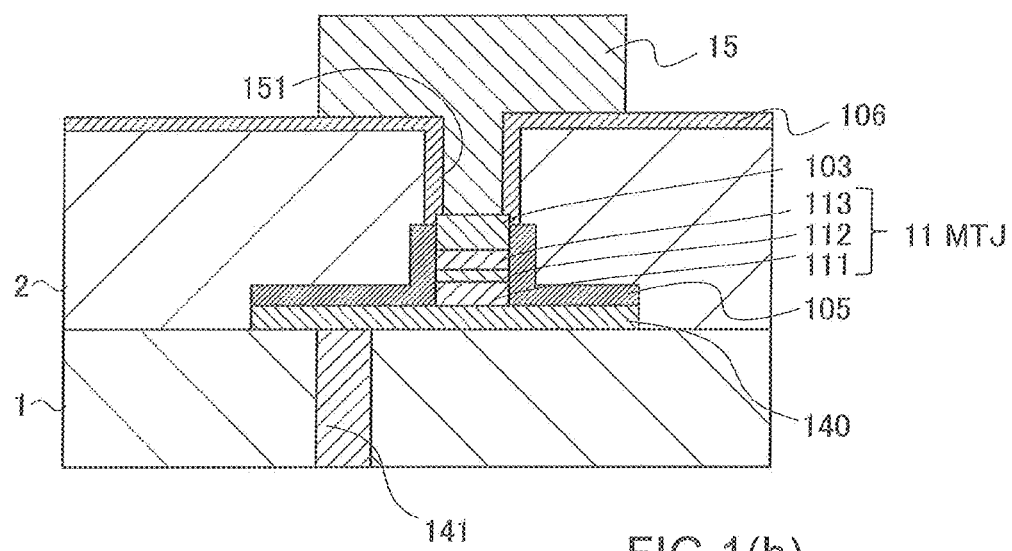
Figure 2:
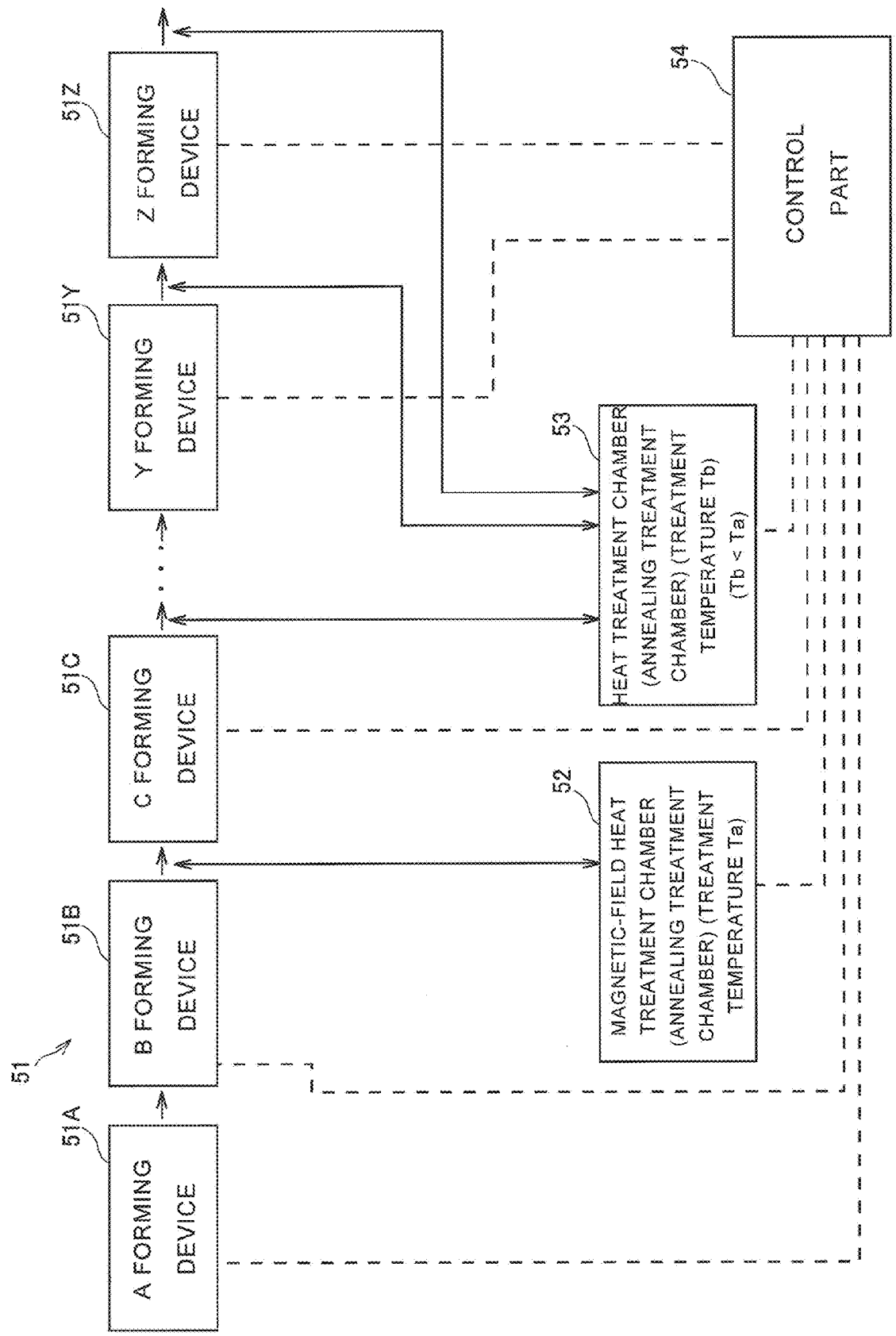
FIG. 2 is a conceptual diagram showing an example of an apparatus for producing a magnetic memory (semiconductor integrated circuit) according to an embodiment of the present invention.
Figure 3:
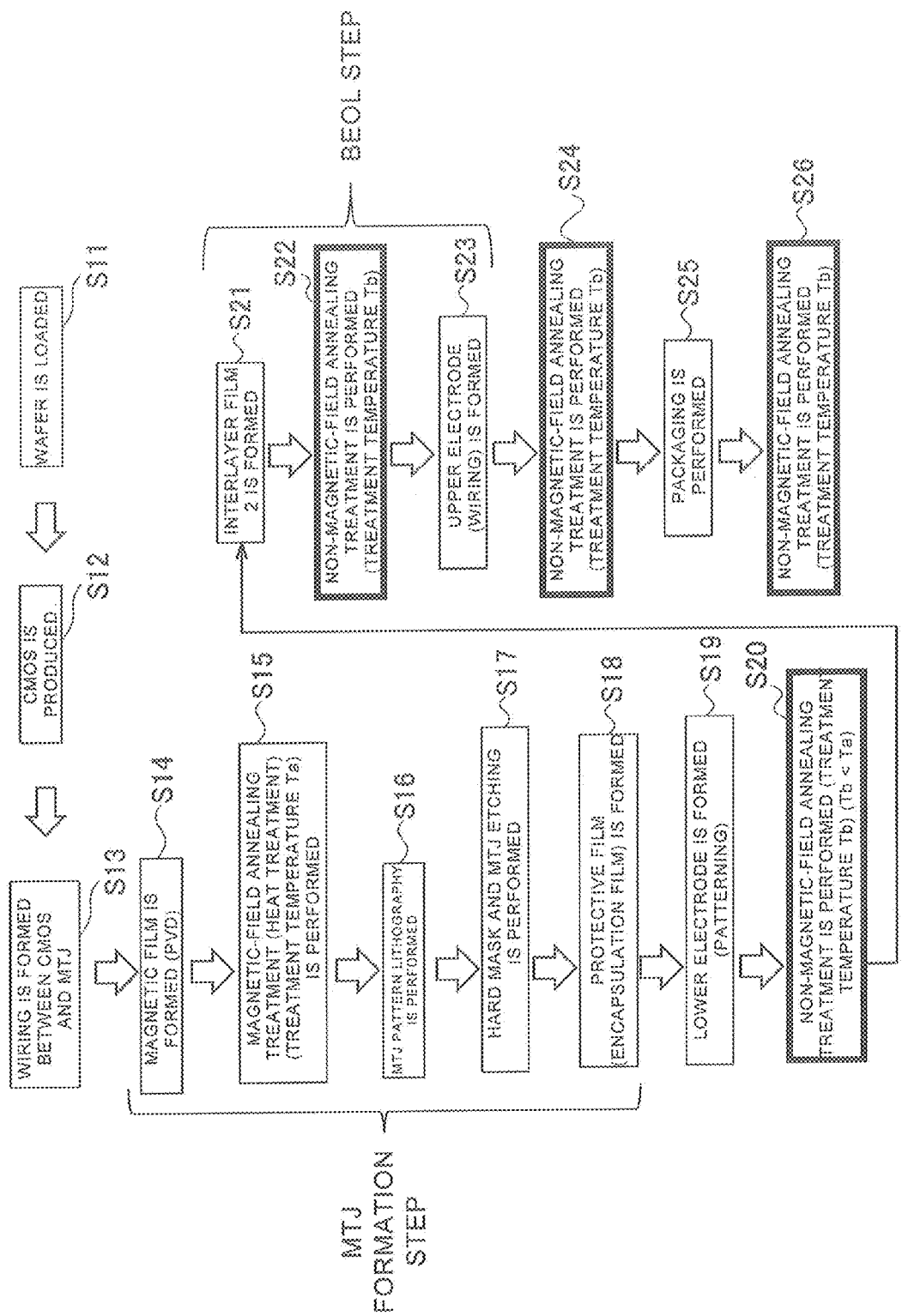
FIG. 3 is a flowchart showing an example of a method for producing a magnetic memory using a magnetic tunnel junction element according to an embodiment of the present invention.

As shown in FIG. 1, a magnetic memory 10 (semiconductor integrated circuit) using a magnetic tunnel junction element according to an embodiment of the present invention is composed of an MRAM (magnetic memory) having a large number of MTJ elements 11 (magnetic tunnel junction elements) and is produced by performing the production steps shown in FIG. 3 by an apparatus for producing a magnetic memory having a plurality of various forming devices 51, a magnetic-field heat treatment chamber 52, a heat treatment chamber 53, a control unit 54, and the like shown in FIG. 2. FIG. 4 to FIG. 10 are views for explaining an example of a detailed method for producing the magnetic memory 10.

In the present embodiment, as shown in FIG. 1(a), in the magnetic memory 10, a CMOS 13 is provided on a wafer 12 serving as a substrate, and a multilayer intermediate wiring 14 (for example, M1 to M4) is provided on the CMOS 13. In the present embodiment, an example of an intermediate wiring composed of four layers is shown, but the total number of wirings can be changed according to the application of the MRAM, and the formation location of the MTJ elements 11 is also not necessarily limited to that on the M4 wiring. The MTJ elements 11 are provided on the intermediate wiring 14. The MTJ elements 11 and the intermediate wiring 14 are electrically connected to each other. An upper wiring 15 is provided on top of the MTJ elements 11, and the MTJ elements 11 and an upper wiring 15 are electrically connected to each other.

Specifically, as shown in FIG. 1(b), a lower electrode 140 is provided on a first interlayer film 1. The first interlayer film 1 is formed of an insulating material and is disposed above the CMOS 13 provided on the wafer 12 serving as a substrate. A conductive via 141 (VIA) is provided in the first interlayer film 1, and the via 141 has a structure that electrically connects the lower electrode 140, the CMOS 13 and the like. The provided MTJ element 11 has a first magnetic layer (conductive layer) as a reference layer 111 adjacent to the lower electrode 140, a barrier layer 112 as a non-magnetic layer, and a second magnetic layer (conductive layer) as a recording layer 113. A conductive hard mask 103 is provided adjacent to the recording layer 113. A conductive via 151 and the upper wiring 15 are provided adjacent to the hard mask 103.

Further, a protective film 105 (encapsulation film) is provided on the side surface of the MTJ element 11 to obtain a structure protecting the MTJ element 11. A second interlayer film 2 is provided around the protective film 105, and a diffusion prevention film 106 is provided between the second interlayer film 2 and the upper wiring 15.

The first magnetic layer serving as the reference layer 111 and the second magnetic layer serving as the recording layer 113 are made of a material including a ferromagnetic material such as an alloy including Co, Fe, and Ni, for example, CoFeB.

The barrier layer 112, which is a non-magnetic layer, is made of a material having a compound, for example, such as $MgO$, $Al_2O_3$, $SiO_2$, $TiO$, and $HfO$.

As shown in FIG. 2, the apparatus for producing a magnetic memory according to the embodiment of the present invention includes a plurality of various forming devices 51, the magnetic-field heat treatment chamber 52, the heat treatment chamber 53 as a non-magnetic-field annealing treatment chamber, the control unit 54 and the like. Further, the production apparatus may include an inspection apparatus for inspecting the substrate or the like treated by each forming device.

In the present embodiment, the forming device 51 has an A forming device 51A, a B forming device 51B, a C forming device 51C, ..., an Y forming device 51Y, a Z forming device 51Z, and the like. More specifically, each forming device 51 includes a film forming device such as a sputtering device, a resist coating device, an exposure device, an etching device, a chemical vapor deposition device, a chemical-mechanical polishing device, a plating device, a dicing device, a die bonding device, a wire bonding device, a resin sealing device and the like.

After the first magnetic layer which is the reference layer 111, the nonmagnetic barrier layer 112 and the second magnetic layer which is the recording layer 113 have been formed on the substrate, the substrate is subjected to natural cooling or forced cooling to room temperature, and then magnetization is performed in the magnetic-field annealing treatment chamber (magnetic-field heat treatment chamber 52) by applying a magnetic field in the direction perpendicular to the surface of the reference layer 111 so as to arrange the magnetization of the reference layer 111 perpendicular to the surface thereof in vacuum, while performing annealing treatment of the substrate at the first treatment temperature Ta in the chamber. The substrate having the MTJ elements is treated according to the next step in the next forming device. In the present embodiment, it is assumed that the room temperature is about 1° C. to 30° C.

With the heat treatment chamber 53 (non-magnetic-field annealing treatment chamber), after the formation treatment that is performed by various forming devices 51 and generates thermal history, annealing treatment is implemented, as necessary, at the second treatment temperature Tb on the MTJ elements and protective film (encapsulation film) formed on the substrate, thereby relieving stress and strain in the MTJ elements and the protective film. The second treatment temperature Tb is set lower than the first treatment temperature Ta.

The magnetic memory is produced under integral control of the forming device 51, the magnetic-field heat treatment chamber 52 (magnetic-field annealing treatment chamber), the heat treatment chamber 53 (annealing treatment chamber) as the non-magnetic-field annealing treatment chamber, and the like by the control unit 54 (control device). Specifically, the control part 54 is constituted by a computer, and executes a control program to realize the method for producing a magnetic memory according to the present invention.

Next, a method for producing a magnetic memory according to the embodiment of the present invention will be described.

As shown in FIG. 3, the wafer 12 made of silicon or the like, which is to be a substrate, is loaded into the predetermined forming device 51 (step S11), the CMOS 13 is formed on the surface of the wafer 12 (step S12), and the multilayer intermediate wiring 14 (for example M1 to M4) for connecting the MTJ elements 11 is formed on the CMOS 13 (step S13).

Figure 4A:
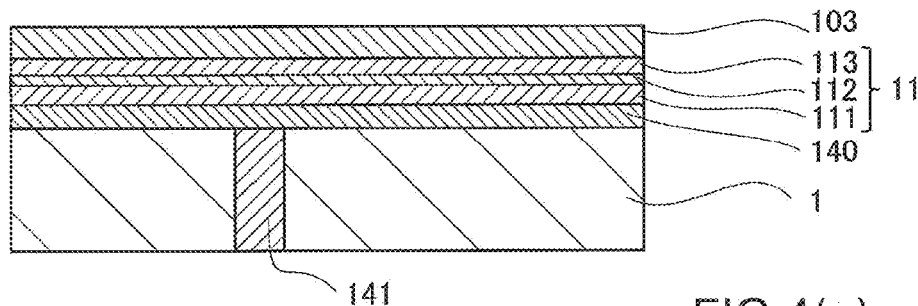
FIG. 4 shows an example of a method for producing a magnetic memory.

Then, the first interlayer film 1 is formed on the intermediate wiring 14, and a via hole is formed in the first interlayer film 1 (see FIG. 4(a)).

Next, in step S14, a conductive layer serving as the lower electrode 140, the first magnetic film serving as the reference layer 111, the barrier layer 112 serving as the non-magnetic layer, the second magnetic film serving as the recording layer 113, and the hard mask 103 are successively deposited adjacent to the first interlayer film 1 by using a film forming device, for example, a physical vapor deposition (PVD) device, in particular with a sputtering device in the present embodiment. In the abovementioned film formation step, heating from room temperature can be performed as necessary. When a conductive layer serving as the lower electrode 140 is formed, a conductive material is deposited for electric connection into the via hole provided in the first interlayer film 1, thereby forming an electric contact with the via 141 (VIA).

Figure 4B:
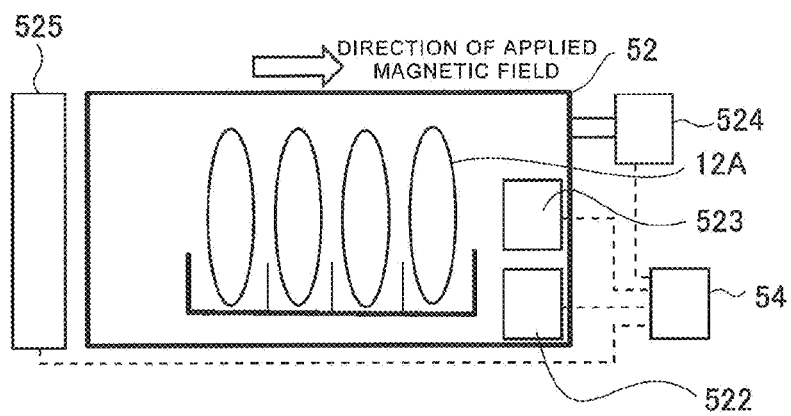

Next, in step S15, as shown in FIG. 4(b), magnetic-field annealing treatment is implemented on the wafer 12A (substrate), on which the magnetic film and the like have been formed, in the magnetic-field heat treatment chamber 52 (magnetic-field annealing treatment chamber) dedicated for annealing treatment. Specifically, the magnetic-field heat treatment chamber 52 is provided with a heating unit 522 such as a heater, a temperature sensor 523, a vacuum pump 524, a magnetic field generator 525 and the like. The control unit 54 integrally controls each constituent element of the magnetic-field heat treatment chamber 52.

Specifically, as the magnetic-field annealing treatment, the wafer 12A (substrate) on which the magnetic film or the like has been formed is placed in the heat treatment chamber 52 in a room temperature state, the inside of the heat treatment chamber 52 is set in a vacuum state with the vacuum pump 524, a magnetic field is applied by the magnetic field generator 525 in a direction perpendicular (orthogonal direction) to the surface of the first magnetic film serving as the reference layer 111, while the inside of the heat treatment chamber 52 is heated to the first treatment temperature Ta (about 380° C. to 420° C.; in the present embodiment, 400° C.) by the heating unit 522, the heating unit 522 is turned off after a predetermined time has elapsed, and after the room temperature is reached, the substrate subjected to the annealing treatment is taken out of the heat treatment chamber 52. Then, the film performance of the magnetic film is inspected by the inspection device. In the present embodiment, it is assumed that the room temperature is about 1° C. to 30° C.

Figure 4C:
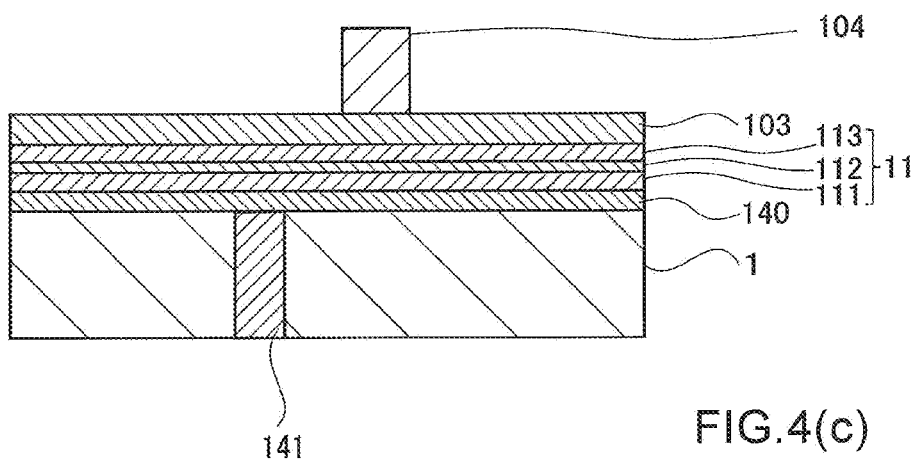

In step S16, as shown in FIG. 4(c), an MTJ pattern 104 is produced by lithography. Specifically, a photoresist is coated on the hard mask 103 by a resist coating device (the treatment temperature is room temperature), and baking treatment is carried out (at about 100° C.). Next, the pattern of the photomask is transferred to the photoresist by the exposure device (the treatment temperature is room temperature). Next, post-baking treatment is implemented thereon to remove unexposed portions (about 150° C.). The inspection device inspects the shape of the lithography.

Figure 5A:
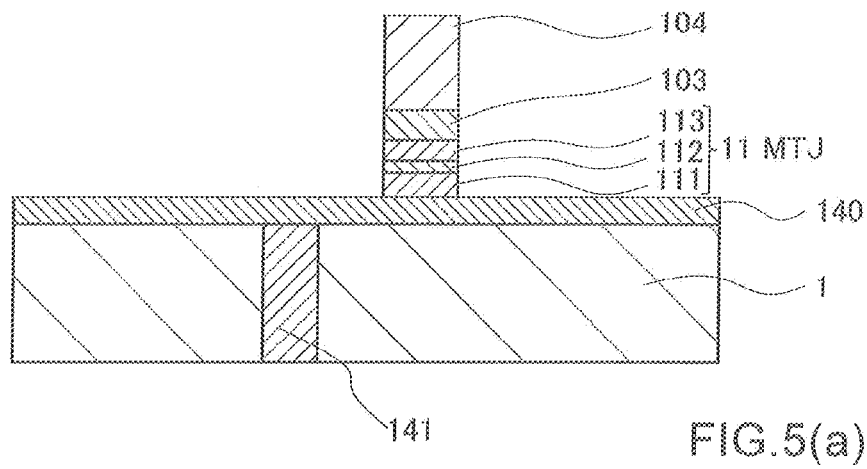
FIG. 5 is a conceptual diagram for explaining an example of a method for producing a magnetic memory.

In step S17, etching treatment is performed on the hard mask and the MTJ. Specifically, by implementing etching treatment with a reactive ion etching device (the treatment temperature is room temperature) on the substrate on which the MTJ pattern 104 and the like have been formed, the MTJ element 11 and the hard mask 103 are formed in the shape corresponding to the MTJ pattern 104, as shown in FIG. 5(a). After removing the photoresist (MTJ pattern 104), the inspection device inspects the shape of the MTJ element 11.

Figure 5B:
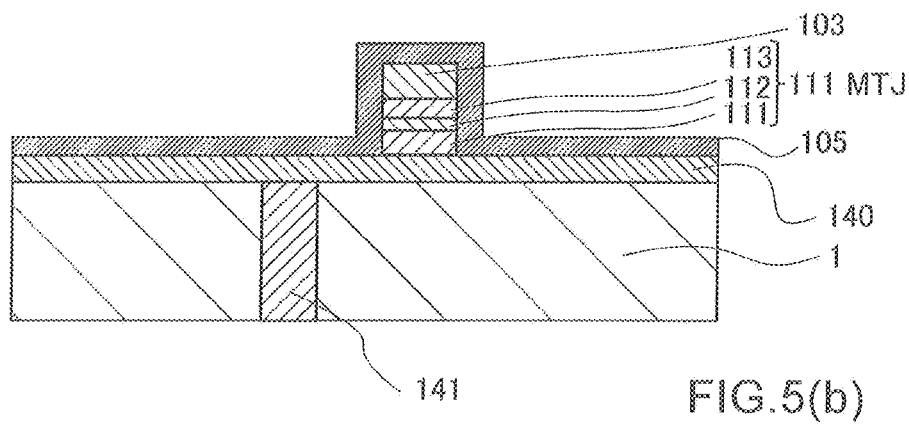

In step S18, the substrate on which the treatment of step S17 has been implemented is placed in a chemical vapor deposition device, a reactive gas is introduced into the device, the substrate is heated to about 200° C. to 300° C., and the protective film 105 (encapsulation film) is formed, as shown in FIG. 5(b), on the conductive layer serving as the lower electrode 140. Specifically, the protective film 105 (encapsulation film) is formed adjacent to the side surface of the MTJ element 11 and the hard mask 103. A material for forming the protective film 105 (encapsulation film) can be exemplified by SiN or the like.

Figure 5C:
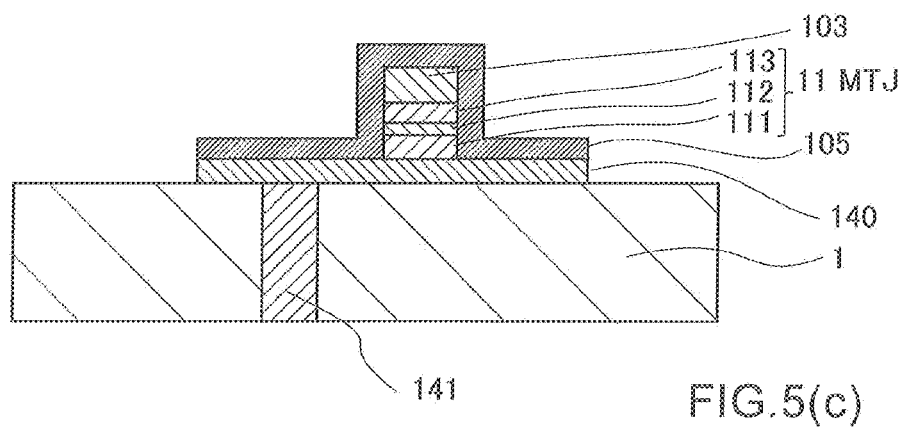

In step S19, the lower electrode 140 having a predetermined shape is formed, as shown in FIG. 5(c), by implementing etching treatment by using a reactive ion etching device on the substrate, which has been subjected to the abovementioned treatment, after forming the lower electrode resist pattern. The treatment temperature in step S19 is about room temperature.

In step S20, annealing treatment (heat treatment) is implemented on the substrate which has been subjected to the abovementioned treatment. Specifically, as shown in FIG.

6(a), a heating unit 532 such as a heater, a temperature sensor 533, a vacuum pump 534, an inert gas supply unit 536 and the like are provided at the heat treatment chamber 53 (annealing treatment chamber). The control unit 54 integrally controls each constituent element of the heat treatment chamber 53.

Specifically, as the annealing treatment, the wafer 12B (substrate), which has been subjected to the abovementioned treatment, is placed in the heat treatment chamber 53 in a state in which no magnetic field is applied and in a room temperature state, the inside of the heat treatment chamber 53 is set in a vacuum state with the vacuum pump 534, the inside of the heat treatment chamber 53 is heated to the second treatment temperature Tb (for example, 200° C. or more and less than 400° C.; in this embodiment, 300° C.) by the heating unit 532, the heating unit 532 is turned off after a predetermined time has elapsed, and after about the room temperature is reached, the substrate subjected to the annealing treatment is taken out of the heat treatment chamber 53. Then, the performance of the MTJ element and the like is inspected by the inspection device.

By implementing the annealing treatment on the wafer 12B (substrate) on which the MTJ element, the protective film 105 and the like have been formed, stress and strain of the MTJ element, the protective film 105 and the like are relieved.

The annealing treatment may be implemented in a state in which an inert gas such as nitrogen gas or argon gas is supplied into the heat treatment chamber 53 by the inert gas supply unit 536 and the inside of the heat treatment chamber 53 is filled with the inert gas.

Figure 6A:
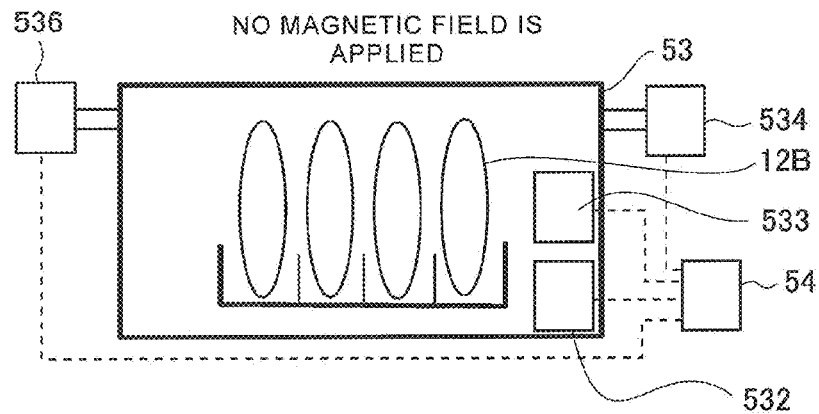
FIG. 6 is a conceptual diagram for explaining an example of a method for producing a magnetic memory, where FIG. 6(*a*) is a view for explaining heat treatment (annealing treatment) using a heat treatment apparatus (annealing apparatus), and FIG. 6(*b*) is a view for explaining a step of forming a second interlayer film.
Figure 6B:
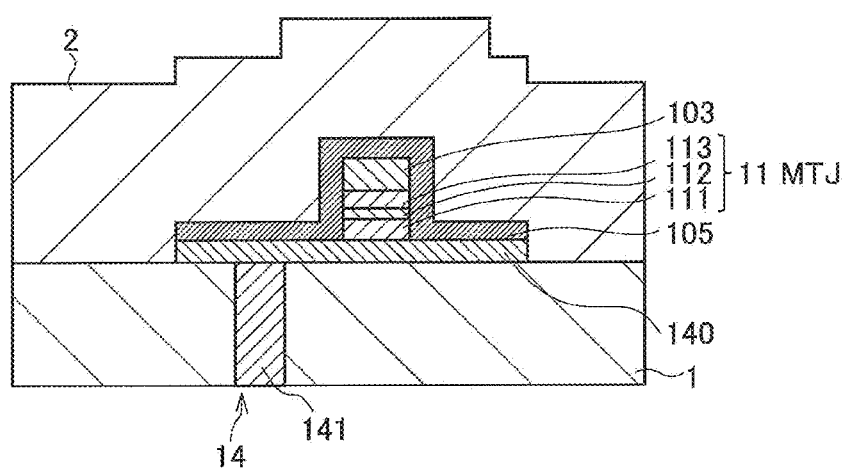

In step S21, the treatment for forming the second interlayer film 2 is performed. Specifically, the substrate subjected to the treatment of step S20 is placed in a chemical vapor deposition device, a reactive gas is introduced into the device, a film is formed while heating the substrate to about 200° C. to 300° C., and the second interlayer film 2 is formed, as shown in FIG. 6(b), adjacent to the first interlayer film 1 and the protective film 105 (encapsulation film).

Figure 7A:
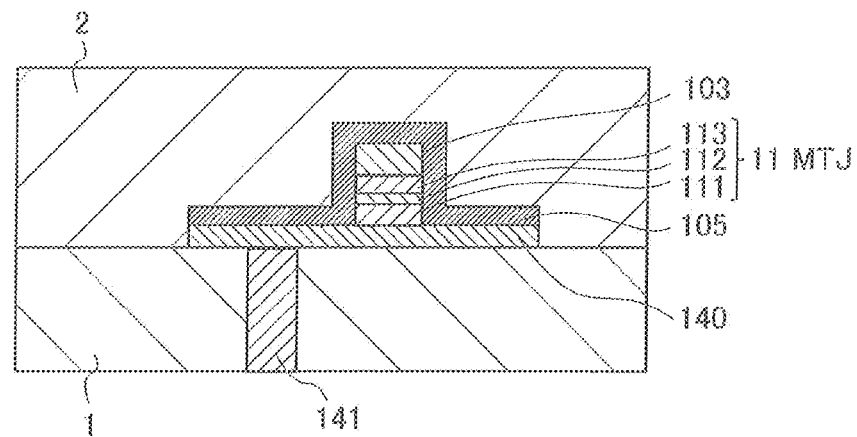
FIG. 7 is a conceptual diagram for explaining an example of a method for producing a magnetic memory, where FIG. 7(*a*) is a view for explaining a step of planarizing a second interlayer film, and FIG. 7(*b*) is a view for explaining heat treatment (annealing treatment) using a heat treatment apparatus (annealing apparatus).

Next, the planarization treatment is performed on the second interlayer film 2. Specifically performed is the treatment for polishing the surface of the second interlayer film 2 with a chemical-mechanical polishing (CMP) apparatus while a polishing agent is applied to the surface of the second interlayer film 2. As shown in FIG. 7(a), the surface of the second interlayer film 2 becomes flat. The treatment temperature of the planarization treatment is about room temperature.

Figure 7B:
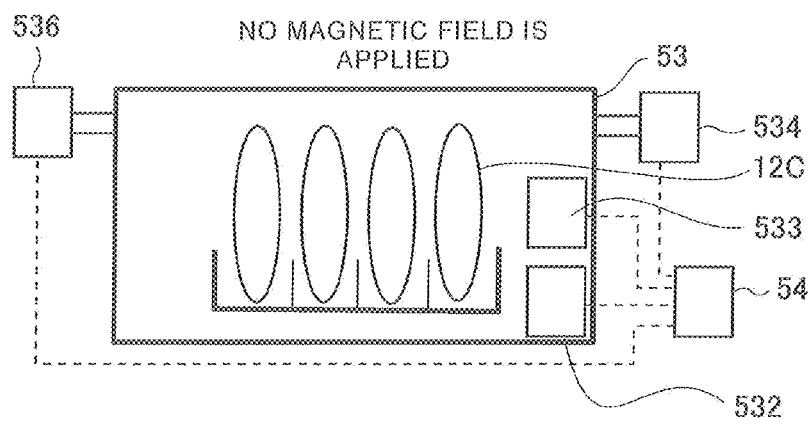

In step S22, as shown in FIG. 7(b), annealing treatment is performed on the substrate subjected to the planarization treatment. The description of the configuration of the heat treatment chamber 53 (annealing treatment chamber) is omitted. The annealing treatment is the same as that of step S20. Specifically, the wafer 12C (substrate) subjected to the abovementioned treatment is placed in the heat treatment chamber 53 in a state in which no magnetic field is applied and in a room temperature state, the inside of the heat treatment chamber 53 is set in a vacuum state or inert gas atmosphere, the inside of the heat treatment chamber 53 is heated to the second treatment temperature Tb (for example, 200° C. or more and less than 400° C.; in this embodiment, 300° C.) by the heating unit 532, the heating unit 532 is turned off after a predetermined time has elapsed, and after about the room temperature is reached, the substrate subjected to the annealing treatment is taken out of the heat treatment chamber 53. Then, the state of CMP planarization is inspected by the inspection device.

In step S23, the substrate treated in step S22 is subjected to the upper wiring formation treatment. In the present embodiment, the upper wiring film formation treatment and the upper wiring patterning treatment are performed after the via (via hole) formation treatment and the diffusion prevention film formation treatment.

Figure 8A:
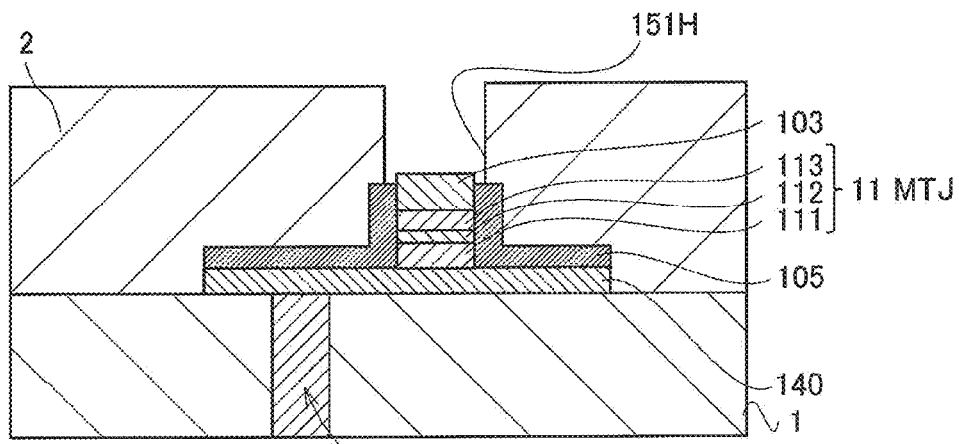
FIG. 8 is a conceptual diagram for explaining an example of a method for producing a magnetic memory, where FIG. 8(*a*) is a cross-sectional view showing an example of a state in which a via is formed in the second interlayer film, FIG. 8(*b*) is a view for explaining an example of a state in which a diffusion prevention film is formed, and FIG. 8(*c*) is a view for explaining an example of a state in which an upper wiring is formed.

Specifically, first, as shown in FIG. 8(a), the treatment for forming a via (via hole) in the second interlayer film 2 is performed. More specifically, after a lithography pattern corresponding to a via hole is formed, etching treatment is performed by the reactive ion etching device, and a via hole 151H is formed. The treatment temperature in step S23 is about room temperature.

Figure 8B:
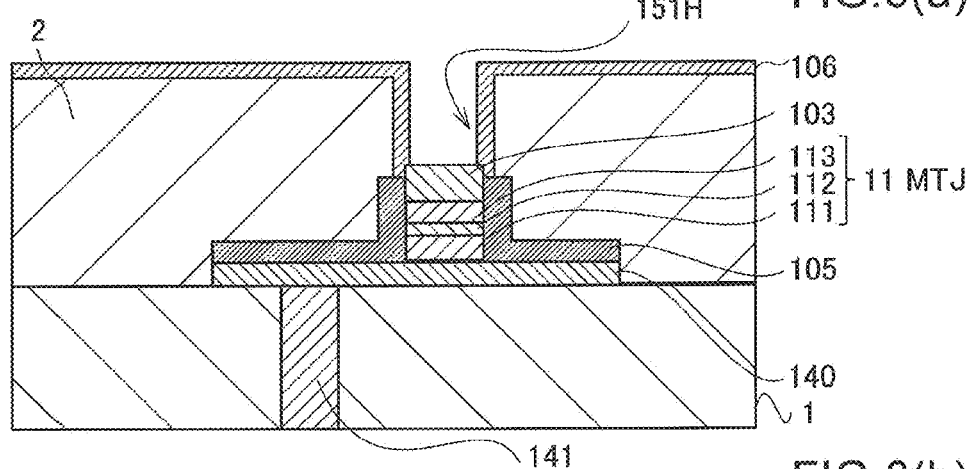

Next, the treatment for forming the diffusion prevention film 106 is performed. Specifically, the substrate having the via hole 151H and the like formed therein is placed in a chemical vapor deposition device, a reactive gas is introduced into the device, a film is formed while heating the substrate to about 200° C. to 300° C., and the diffusion prevention film 106 is formed, as shown in FIG. 8(b), on the surface of the second interlayer film 2 and the inner surface of the via hole 151H. The material for forming the diffusion prevention film 106 can be exemplified by TiN or the like. The treatment temperature of this diffusion prevention film formation treatment is about 200° C. to 300° C.

Figure 8C:
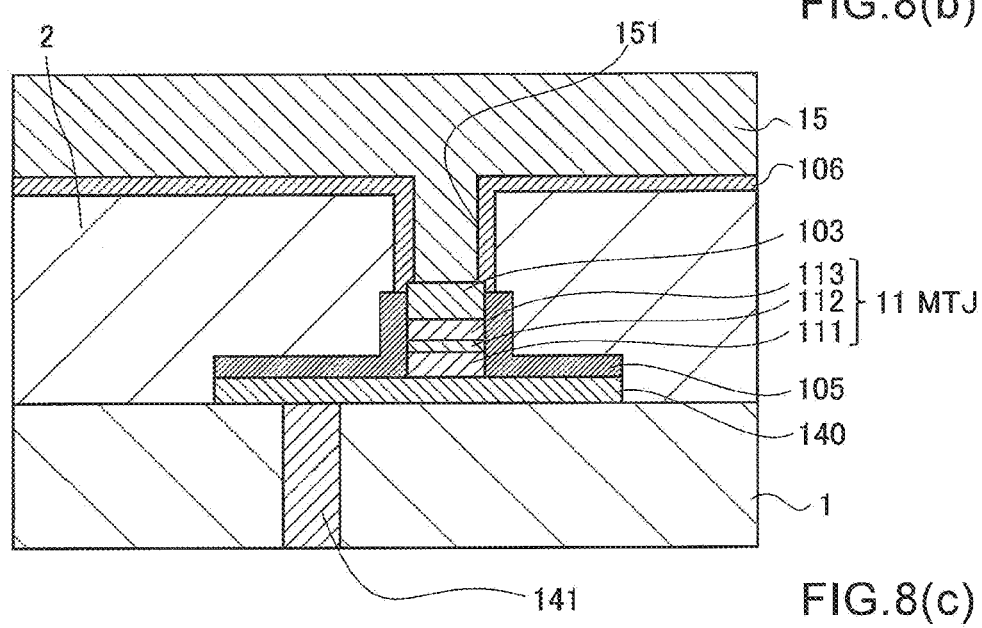

Next, as shown in FIG. 8(c), an upper wiring film serving as the upper wiring 15 is formed adjacent to the diffusion prevention film 106 with an electroless plating device. The treatment temperature is about room temperature. For example, Cu or the like can be used as the material for forming the upper wiring. In addition, by forming a film of Cu or the like in the via hole 151H, the via 151 is formed.

Figure 9A:
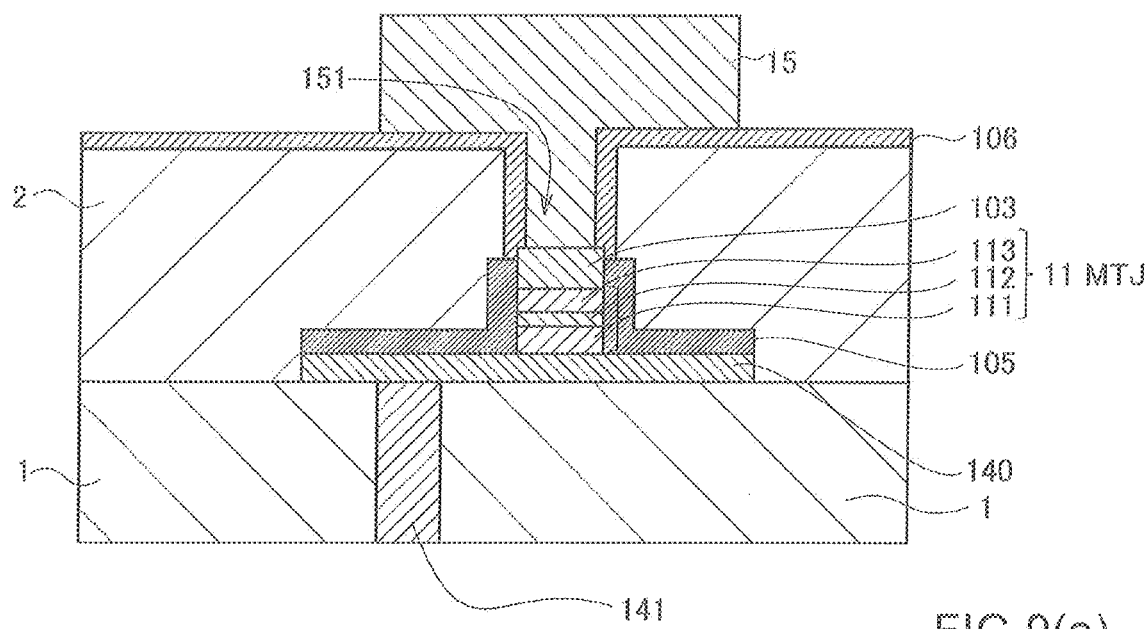
FIG. 9 is a conceptual diagram for explaining an example of a method for producing a magnetic memory, where FIG. 9(*a*) is a view for explaining patterning of the upper wiring, FIG. 9(*b*) is a view for explaining heat treatment (annealing treatment) using a heat treatment apparatus (annealing apparatus), and FIG. 9(*c*) is a view for explaining a step of cutting a chip from a wafer in which an MTJ element has been formed.

Next, the upper wiring patterning treatment is performed. Specifically, after forming a lithography pattern corresponding to the shape of the upper wiring, etching treatment is performed on the upper wiring film by a reactive ion etching device, thereby forming, as shown in FIG. 9(a), the upper wiring 15 having a predetermined shape. The treatment temperature of this upper wiring patterning treatment is about room temperature.

Figure 9B:
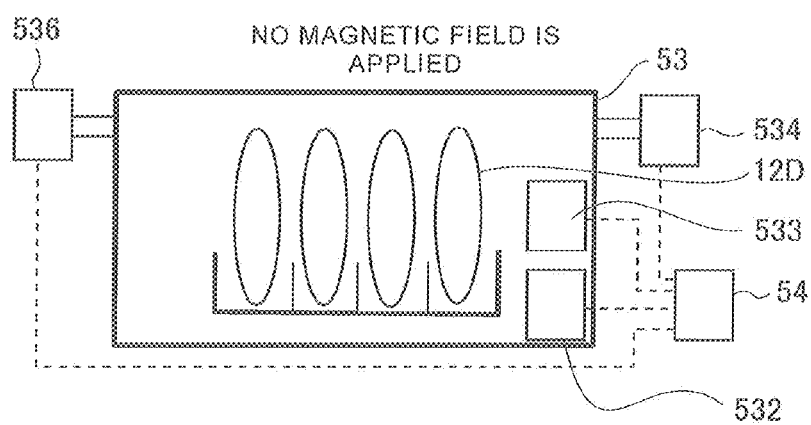

In step S24, annealing treatment is performed, as shown in FIG. 9(b), on the substrate subjected to the abovementioned treatment. The description of the configuration of the heat treatment chamber 53 (annealing treatment chamber) is omitted. The annealing treatment is the same as that of steps S20 and S22. Specifically, the wafer 12D (substrate) subjected to the abovementioned treatment is placed in the heat treatment chamber 53 in a state in which no magnetic field is applied and in a room temperature state, the inside of the heat treatment chamber 53 is set in a vacuum state or inert gas atmosphere, the inside of the heat treatment chamber 53 is heated to the second treatment temperature Tb (for example, 200° C. or more and less than 400° C.; in this embodiment, 300° C.) by the heating unit 532, the heating unit 532 is turned off after a predetermined time has elapsed, and after about the room temperature is reached, the substrate subjected to the annealing treatment is taken out of the heat treatment chamber 53. Then, the performance of the MTJ element and the like is inspected by the inspection device.

Steps S21 and S23 are referred to as a wiring formation step (BEOL: Back end of line).

In step S25, packaging treatment is performed. In the present embodiment, a chip cutting-out treatment, a chip die bonding treatment, a wire bonding treatment, a resin sealing treatment and the like are performed as the packaging treatment.

Figure 9C:
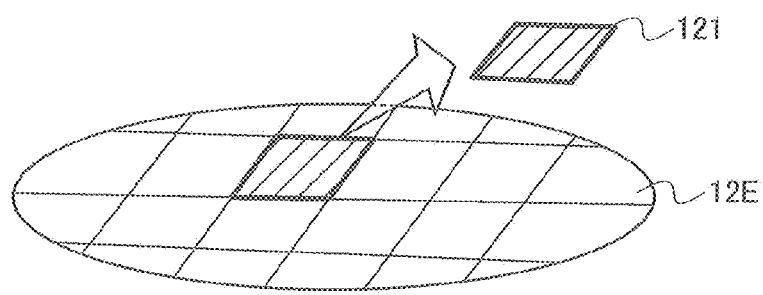

Specifically, as the chip cutting-out treatment, as shown in FIG. 9(c), the wafer 12E (substrate) subjected to the treatment up to step S24 is cut out in a chip shape by a dicing device to prepare a chip 121 of a predetermined size. The treatment temperature is room temperature. In the present embodiment, the diameter of the wafer is 300 mm.

Figure 10A:
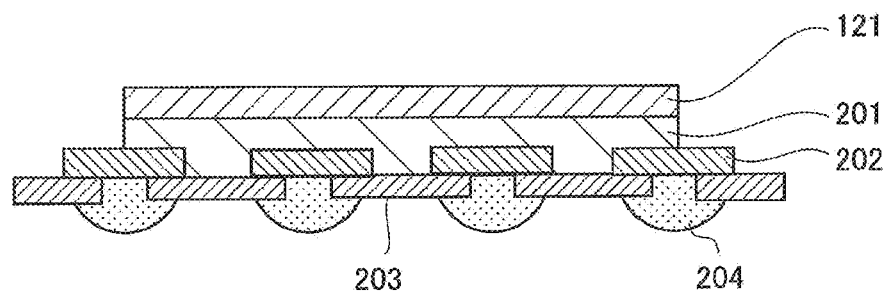
FIG. 10 shows an example of a method for producing a magnetic memory, where FIG. 10(*a*) is a cross-sectional view showing an example of a state in which a chip is die-bonded, FIG. 10(*b*) is a cross-sectional view of a resin-sealed magnetic memory, and FIG. 10(*c*) is a view for explaining heat treatment (annealing treatment) using a heat treatment apparatus (annealing apparatus).

As the chip die bonding treatment, as shown in FIG. 10(a), the chip 121 is bonded onto the circuit substrate through a bonding layer 201 made of a conductive adhesive material. The circuit substrate is configured of an insulating material 203, a metal pattern 202 as a circuit pattern, and a conductor 204 such as a solder. When a conductive adhesive material is used, the treatment temperature of the chip die bonding treatment is about 150° C. to 200° C.

Figure 10B:
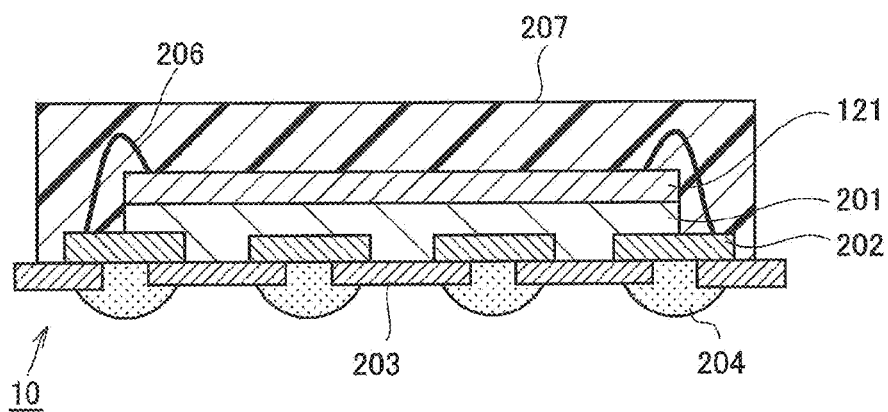

As the wire bonding treatment, as shown in FIG. 10(b), a predetermined portion of the chip 121 and a predetermined portion of the metal pattern 202 of the circuit substrate are electrically connected to each other by a wire bonding metal wire 206.

As the resin sealing treatment, as shown in FIG. 10(b), the chip 121 and the metal wire 206 on the circuit substrate are sealed with a resin material 207. Through the series of treatment operations described above, the magnetic memory 10 is fabricated. The treatment temperature of the bonding portion is about 150° C. to 300° C. The chip is not heated.

Figure 10C:
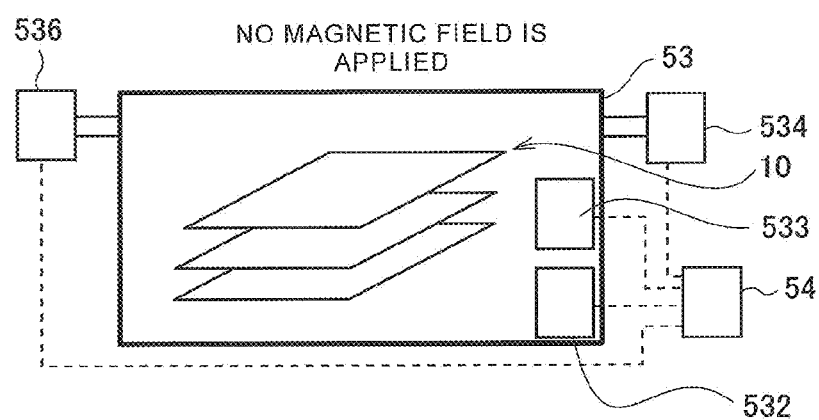

In step S26, as shown in FIG. 10(c), annealing treatment is performed on the fabricated magnetic memory 10. The description of the configuration of the heat treatment chamber 53 (annealing treatment chamber) is omitted. The annealing treatment is the same as that of steps S20, S22 and S24. Specifically, the magnetic memory 10 is placed in the heat treatment chamber 53 in a state in which no magnetic field is applied and in a room temperature state, the inside of the heat treatment chamber 53 is set in a vacuum state or inert gas atmosphere, the inside of the heat treatment chamber 53 is heated to the second treatment temperature Tb (for example, 200° C. or more and less than 400° C.; in this embodiment, 300° C.) by the heating unit 532, the heating unit 532 is turned off after a predetermined time has elapsed, and after about the room temperature is reached, the magnetic memory 10 subjected to the annealing treatment is taken out of the heat treatment chamber 53. Then, finally, various kinds of performance of the elements and the like are inspected by the inspection device.

Figure 11:
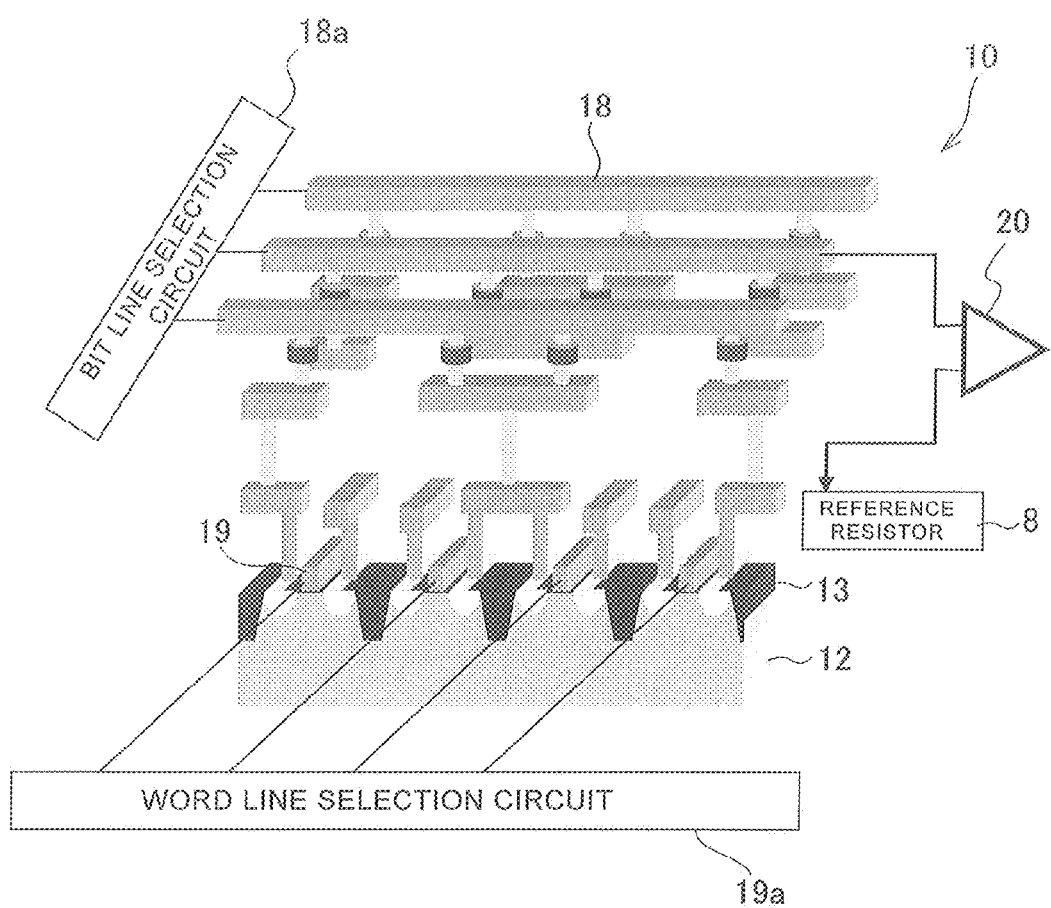
FIG. 11 is a perspective view showing an example of an MTJ array structure of a magnetic memory (semiconductor integrated circuit) using a magnetic tunnel junction element according to an embodiment of the present invention.

As shown in FIG. 11, the produced magnetic memory 10 (semiconductor integrated circuit) is composed of an MRAM in which a plurality of bit lines 18 is wired as upper wirings 15 of the MTJ elements 11 and a plurality of word lines 19 is wired on top of the CMOS 13. The bit lines 18 are arranged parallel to each other and connected to a bit line selection circuit 18a. The word lines 19 are arranged parallel to each other and connected to a word line selection circuit 19a.

When writing to an arbitrary MTJ element 11 in this magnetic memory 10 (semiconductor integrated circuit), a voltage is applied to the predetermined bit line 18 and word line 19 by the bit line selection circuit 18a and the word line selection circuit 19a, respectively, on the basis of a write bit number.

When reading from an arbitrary MTJ element 11, the predetermined bit line 18 and word line 19 are selected by the bit line selection circuit 18a and the word line selection circuit 19a, respectively, based on a read bit number, and the selected lines are connected to a sense amplifier 20. A reference resistor 8 is electrically connected to the sense amplifier.

The annealing treatment with the heat treatment chamber 53 is performed by performing one or more steps among the above-described production steps S20, S22, S24, and S26 of the magnetic memory, so stress and strain of the MTJ element, the protective film (encapsulation film), and the like can be relaxed.

Figure 12:
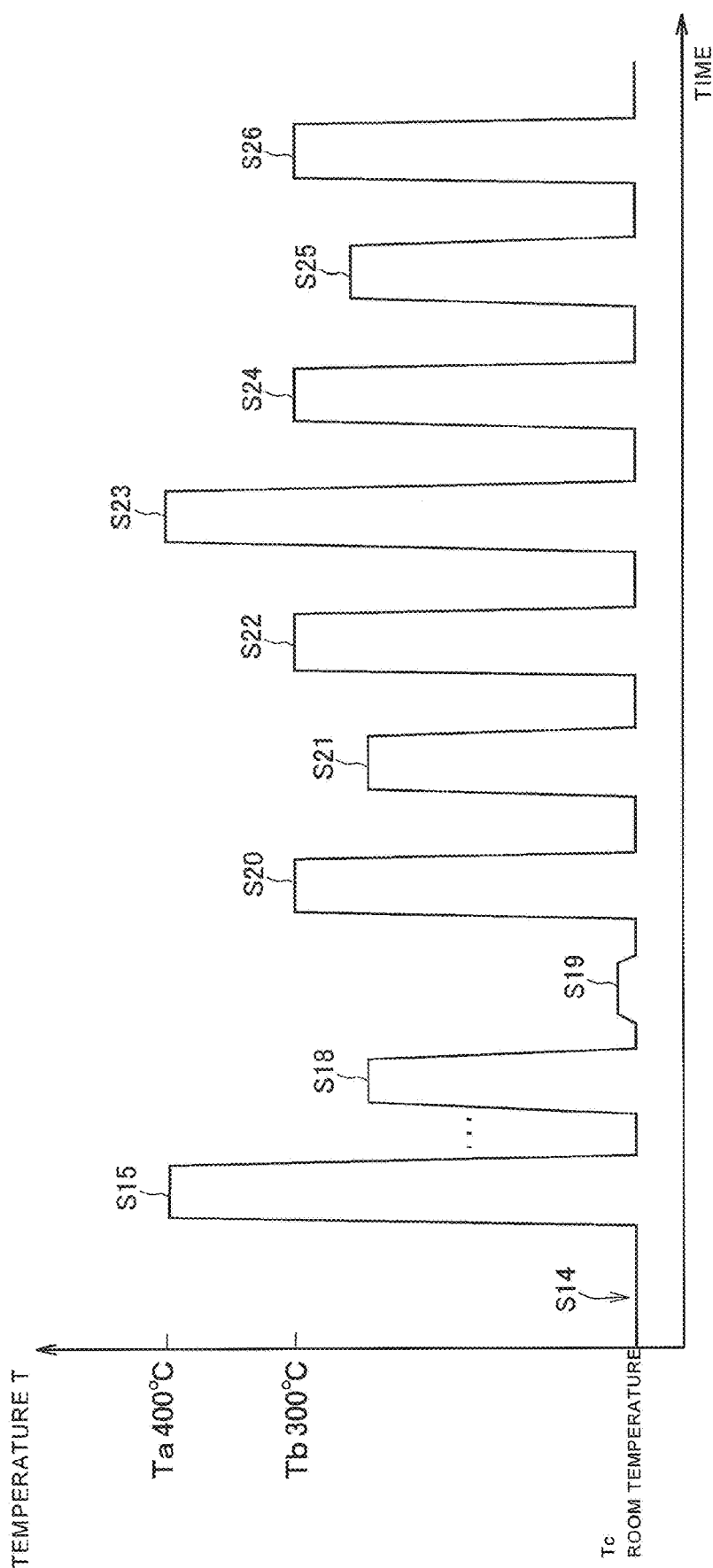
FIG. 12 is a diagram showing an example of a temporal change in temperature during the production of a magnetic memory (semiconductor integrated circuit).

FIG. 12 shows an example of a temporal change in temperature during production of the magnetic memory (semiconductor integrated circuit).

In the present embodiment, the second treatment temperature Tb of the annealing treatment performed with the heat treatment chamber 53 (annealing treatment chamber) is set to be lower than the first treatment temperature Ta in the magnetic-field heat treatment step.

Further, as shown in FIG. 12, since the non-magnetic-field annealing treatment with the heat treatment chamber 53 is performed after the annealing treatment object is naturally cooled or forcibly cooled to room temperature, stress and strain of the MTJ element, the protective film (encapsulation film), and the like can be reliably relaxed.

That is, stress and strain of the protective film (encapsulation film), the MTJ element and the like can be relaxed without degrading the element performance of the MTJ element, and this relaxation of stress and strain can provide a magnetic memory comprising MTJ elements with high performance.

In order to confirm the effect of the method for producing a magnetic memory according to the present invention, the inventors of the present invention actually produced a magnetic memory having a magnetic tunnel junction element (magnetoresistance effect element) and measured the thermal stability index $\Delta_0$ of the magnetoresistance effect element. When it is difficult to perform heat treatment (non-magnetic-field annealing treatment) of all the steps described hereinabove (specifically, steps S20, S22, S24, and S26 shown in FIG. 3) due to limitations imposed by production cost and the like, an effective approach is to perform the heat treatment step (non-magnetic-field annealing treatment step S24) after the step (S23) of forming the upper electrode (upper wiring 15) at which all the steps of producing the MRAM on the wafer are completed. The reason therefor is that since all the steps of producing the MRAM on the wafer which are accompanied by thermal history are completed before the step (S23) of forming the upper electrode (upper wiring 15), where the heat treatment (non-magnetic-field annealing treatment step S24) is performed after the step (S23) of forming the upper electrode (upper wiring 15), stress and strain of the protective film 105, MTJ element 11, and the like which have accumulated during the preceding steps can be relaxed at once.

Figure 13:
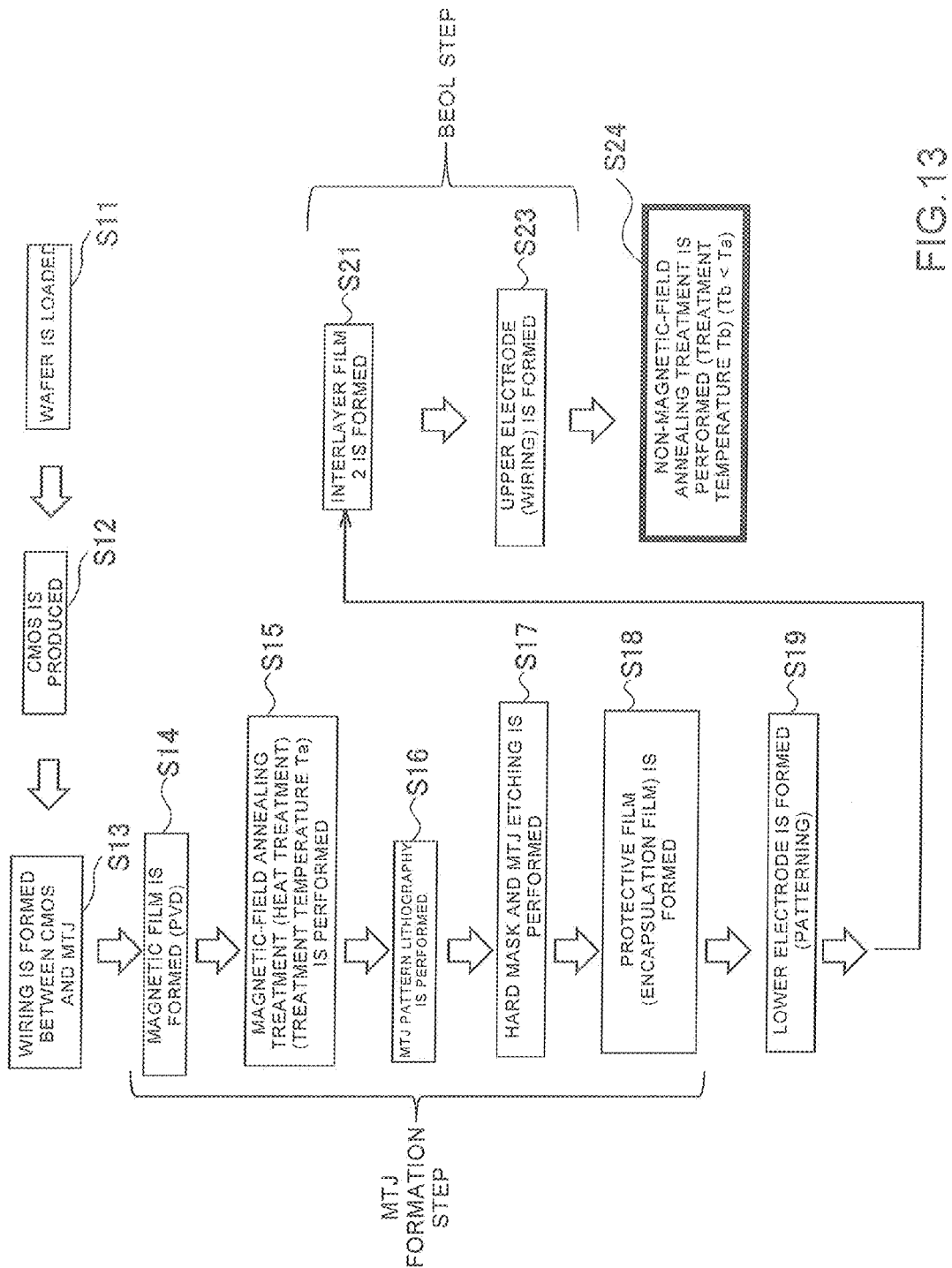
FIG. 13 is a view showing an example of a method for producing a magnetic memory according to an embodiment of the present invention.

FIG. 13 is a flowchart showing an example of a method for producing a magnetic memory according to an embodiment of the present invention. In the method for producing a magnetic memory shown in FIG. 13, steps S11 to S19, S21, S23, and S24 (non-magnetic-field annealing treatment) are executed, and in order to confirm the effect demonstrated by this step S24 (non-magnetic-field annealing treatment), steps S20, S22, S25, and S26 shown in FIG. 3 are not executed.

Figure 14:
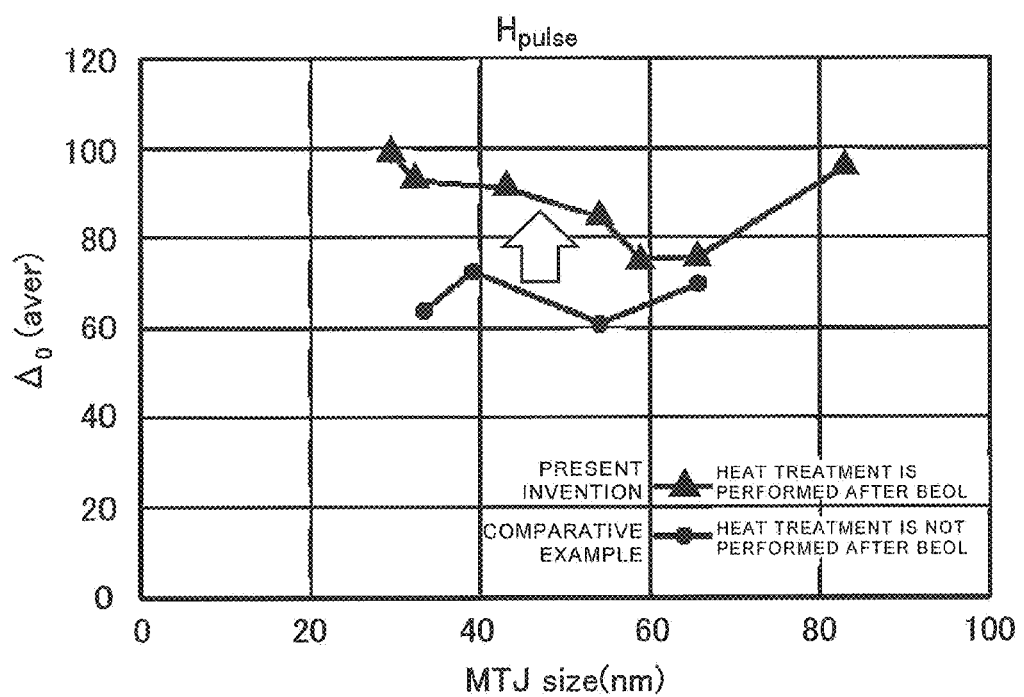
FIG. 14 is a view showing an example a thermal stability index of an MTJ element produced by the method for producing a magnetic memory shown in FIG. 13 and of an MTJ element of a comparative example.

FIG. 14 shows an example of the thermal stability index of the MTJ element produced by the method for producing a magnetic memory shown in FIG. 13 and the thermal stability index of the MTJ element of a comparative example. The measurement of the thermal stability index was carried out by the measurement system shown in FIG. 15.

In FIG. 14, the thermal stability index $\Delta_0$ is plotted against the ordinate and the size of the MTJ element is plotted against the abscissa. In the present embodiment, the size of the MTJ element is the diameter of the cylindrical recording layer.

Triangular marks indicate values of the thermal stability index of the MTJ elements of the magnetic memory produced by the method for producing a magnetic memory according to the embodiment of the present invention shown in FIG. 13, more specifically, by executing steps S11 to S19, S21, S23, and S24 (annealing treatment). That is, annealing treatment with the heat treatment chamber 53 is performed after the BEOL step in steps S21 and S23.

Circle marks indicate values of the thermal stability index of the MTJ elements of the magnetic memory produced by the method for producing a magnetic memory of the comparative example, more specifically, by executing steps S11 to S19, S21, and S23. That is, in the comparative example, no annealing treatment with the heat treatment chamber 53 is performed.

As shown in FIG. 14, the measurement results indicate that the thermal stability index $\Delta_0$ of the MTJ element produced by the method for producing a magnetic memory according to the present invention is larger than that of the comparative example. That is, it was found that by implementing the annealing treatment with the heat treatment chamber 53, stress and strain of the protective film (encapsulation film), the MTJ element and the like are relaxed, and the MTJ element having a high thermal stability index $\Delta_0$ is produced.

According to NPL 2, a failure rate F of a magnetic memory having a capacity of m bits is expressed by an Equation (4) from the Equation (3).

$$F=1-\exp\{-m\times(t/10^{-9})\times\exp(-\Delta_0)\} \quad (4)$$

Therefore, the time t that can secure a failure rate of $10^{-7}$ or less, which can be remedied by a general error compensation circuit, is expressed by an Equation (5).

$$t=\{(-10^{-9})/m\}\times\ln(1-10^{-7})\times\exp(\Delta_0) \quad (5)$$

For example, assuming that an embedded memory of m=64 Mb, which is the main application of the present invention, is used as the capacity of the memory, in the comparative example, since $\Delta_0=70$ when the MTJ size is 40 nm, the above time t is about 0.1 year, but in the magnetic memory according to the present invention, since $\Delta_0$ is about 90 when the MTJ size is 40 nm, the time t is about $6\times10^7$ years, that is, can be enlarged dramatically.

[NPL 2] R. Takemura et al., "A 32-Mb SPRAM With 2T1R Memory Cell, Localized Bi-Directional Write Driver and '1'/'0' Dual-Array Equalized Reference Scheme," IEEE JOURNAL OF SOLID-STATE CIRCUITS, VOL. 45, NO. 4, APRIL 2010

Figure 15:
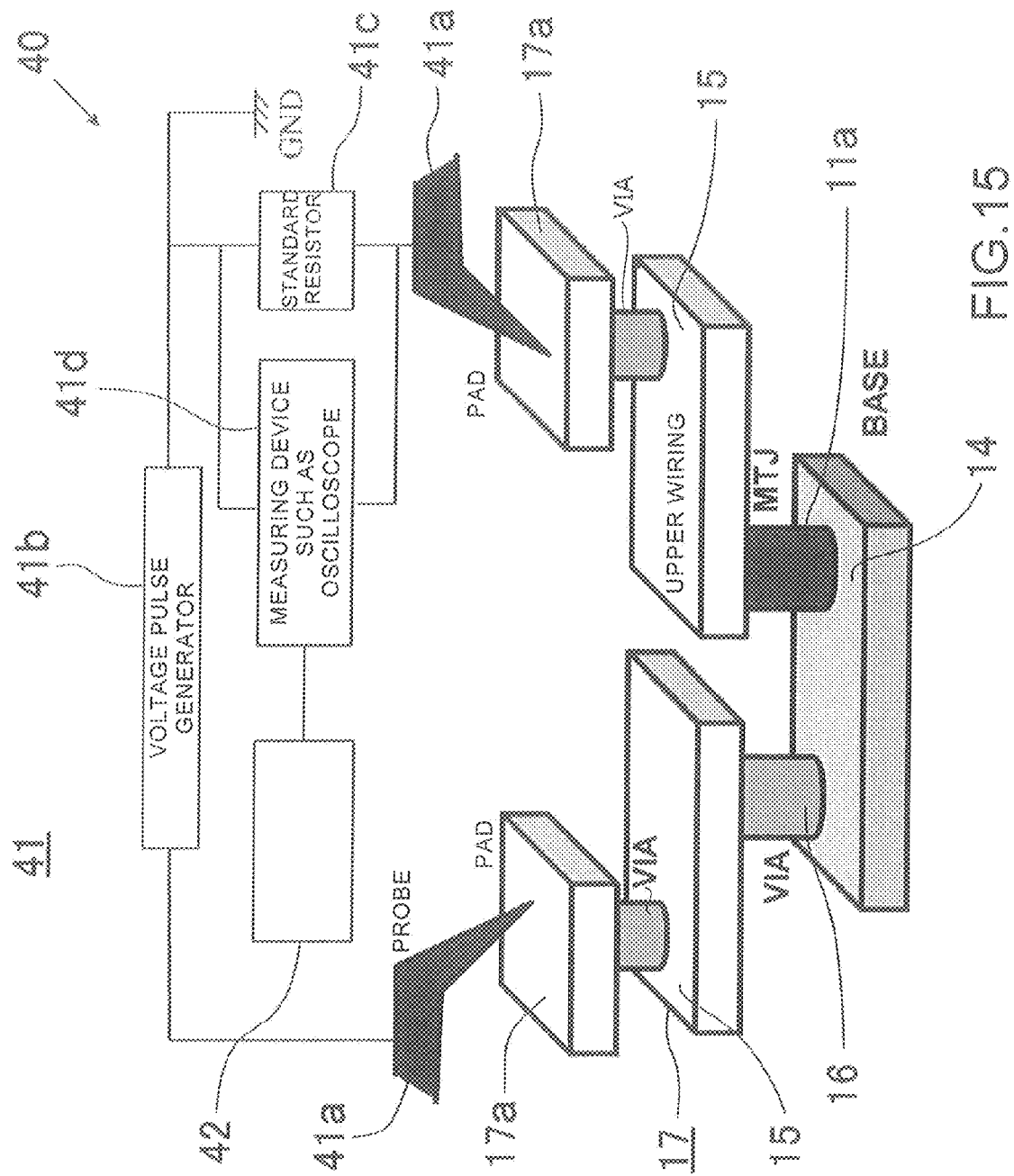
FIG. 15 is a conceptual diagram showing an example of a measurement system for measuring a thermal stability index of an MTJ element according to an embodiment of the present invention.
Figure 16:
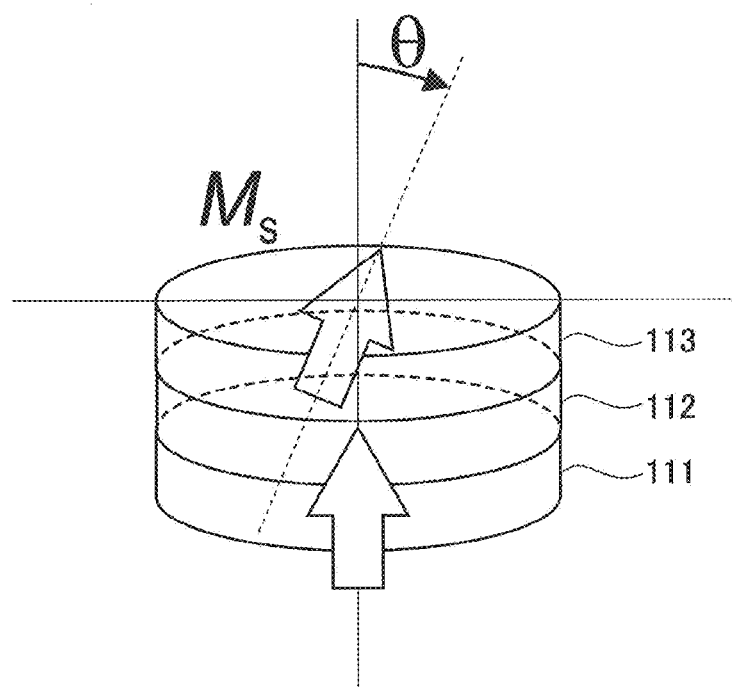
FIG. 16 is a schematic diagram for explaining an MTJ element having a reference layer, a barrier layer, and a recording layer.
Figure 17A:
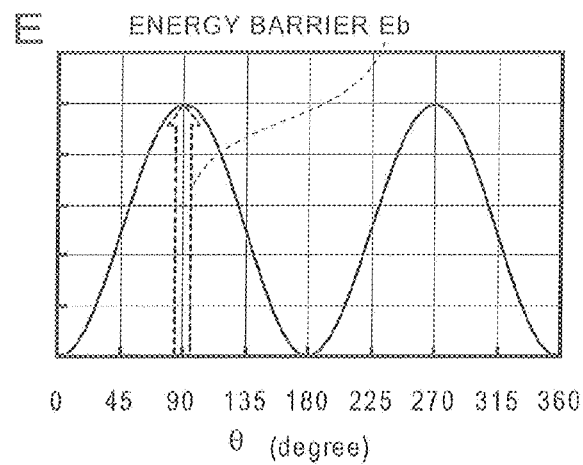
FIG. 17(a) shows a relationship between an angle θ of magnetization of the recording layer and an energy barrier.
Figure 17B:
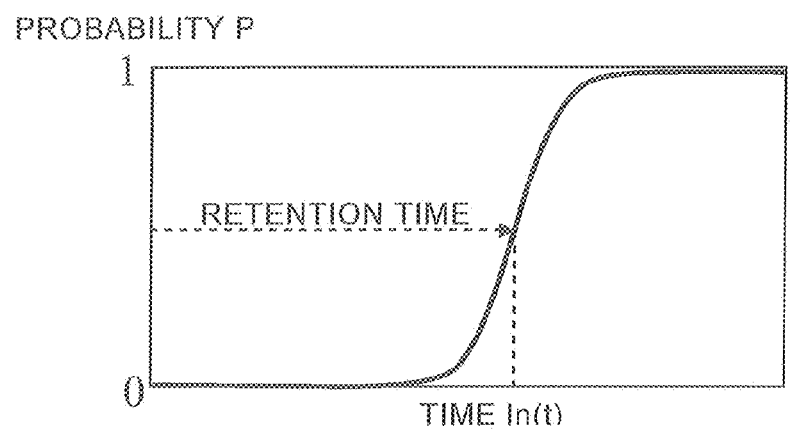
FIG. 17(b) is a view for explaining a retention time of information in the recording layer.

FIG. 15 is a conceptual diagram showing an example of a measurement system for measuring the thermal stability index of the MTJ element according to an embodiment of the present invention.

In the example shown in FIG. 15, a terminal block 17 for inspection configured of the intermediate wiring 14, which is electrically connected only to the evaluation MTJ element 11a, the via 16 (VIA), and the upper wiring 15 is formed.

The terminal block 17 for inspection is configured of a pair of terminals, one of the terminals being configured of the intermediate wiring 14 (BASE), which is connected to the lower part of the single evaluation MTJ element 11a, the via 16 formed thereon, and the upper wiring 15. The terminal block 17 for inspection is configured so as to allow an electric current to flow only to the electrically connected single evaluation MTJ element 11a.

<Measurement of Thermal Stability Index>

Next, a measurement means for measuring the thermal stability index for the single evaluation MTJ element 11a will be described.

As shown in FIG. 15, the measurement system 40 has a temperature maintaining means (not shown), a measurement tool 41, and an analysis means 42.

The temperature maintaining means is composed of a prober capable of adjusting the temperature, and is configured to be able to hold the wafer 12 including the evaluation MTJ element 11a at a predetermined temperature.

The measurement means 41 has a pair of probes 41a of the prober of the temperature maintaining means and, for example, a voltage pulse generator 41b, a standard resistor 41c, and a voltage measuring device 41d.

The voltage pulse generator 41b is connected to the probe 41a and is capable of applying a voltage pulse between the probes 41a. The standard resistor 41c is connected in series between one probe 41a and the voltage pulse generator 41b.

The voltage measuring device 41d is composed of a measuring device such as an oscilloscope capable of measuring a voltage and is configured to be connected in parallel to the standard resistor 41c so as to be able to measure the voltage generated at the standard resistor 41c. For example, a DC current source and a trigger mechanism for designating the timing of generating a current from the DC current source may be used instead of the voltage pulse generator 41b.

The measurement means 41 is configured so that the probes 41a are brought into contact with a pad 17a connected through the via (VIA) to the upper wiring 15 of each terminal block 17 for inspection of the evaluation MTJ element 11a, and a predetermined voltage pulse is generated by the voltage pulse generator 41b and is applied to both ends of the evaluation MTJ element 11a so as to allow a predetermined current to flow to the evaluation MTJ element 11a. Further, by monitoring and measuring the voltage generated across the standard resistor 41c, which is generated by the current, with the voltage measuring device 41d for a predetermined time, it is possible to measure a change in the resistance value of the evaluation MTJ element 11a.

The analysis means 42 is composed of a computer and is configured to be connected to the voltage measuring device 41d so as to be able to input the measured value of the voltage measuring device 41d. The analysis means 42 is configured to be able to calculate a time constant $\tau_p$ for maintaining a low-resistance state and a time constant $\tau_{AP}$ for maintaining a high-resistance state from the change in the resistance value measured by the voltage measuring device 41d.

Specifically, a change in the resistance value is measured for each current, while allowing a plurality of currents of different magnitudes to flow sequentially, a frequency distribution $N_p(t)$ of the time for maintaining the low-resistance state and a frequency distribution $N_{AP}(t)$ of the time for maintaining the high-resistance state are obtained from the change in the resistance value, and the time constant $\tau_p$ for maintaining the low-resistance state and the time constant TAP for maintaining the high-resistance state are calculated by using the relationships $N_p(t) \propto \exp(-t/\tau_p)$ and $N_{AP}(t) \propto \exp(-t/\tau_{AP})$, respectively.

Further, the thermal stability index $\Delta_0$ and $I_{c0}$ are calculated by an Equation (6) on the basis of a predetermined current I, the time constant $\tau_p$ for maintaining the low-resistance state and the time constant $\tau_{AP}$ for maintaining the high-resistance state.

$$\tau_p/(\tau_p+\tau_{AP})=1/[1+\exp\{-\Delta_0(2I/I_{c0})\}] \quad (6)$$

Described hereinabove is a measurement means for measuring the thermal stability index $\Delta_0$ with the measurement system shown in FIG. 15, but this measurement means is not limiting, and other measurement means, for example a magnetic field pulse method, a current pulse method or the like may be used, provided that the thermal stability index of the MTJ element can be measured.

Further, as described hereinabove, in the method for producing a magnetic memory comprising a magnetic tunnel junction element (magnetoresistance effect element) according to an embodiment of the present invention, after at least any one or more steps among the steps following the magnetic-field heat treatment step at the first treatment temperature Ta, namely, a step of forming a protective film 105 (encapsulation film) such as SiN that protects the MTJ element, a step of forming the second interlayer film 2, an upper wiring formation step, and a packaging step, annealing treatment is implemented in the heat treatment chamber 53 (annealing treatment chamber) on the substrate, on which the MTJ element, the protective film, and the like have been formed, in a state in which no magnetic field is applied, in vacuum or inert gas atmosphere, at a second treatment temperature Tb to relieve stress and strain in the protective film (encapsulation film) and the MTJ element. The second treatment temperature Tb is lower than the first treatment temperature Ta.

More specifically, the method for producing a magnetic memory comprising a magnetic tunnel junction element (MTJ element 11) according to an embodiment of the present invention has a step (S14) of forming a magnetic film having a non-magnetic layer (barrier layer 112) between a first magnetic layer (reference layer 111) and a second magnetic layer (recording layer 113) on a substrate provided with an electrode layer (140); a magnetic-field annealing treatment step (S15) of performing annealing treatment at a first treatment temperature Ta on the substrate in a state in which a magnetic field is applied in the direction perpendicular to the film surface of the first magnetic layer (reference layer 111) or the second magnetic layer (recording layer 113) in vacuum; a step (S17) of forming a magnetic tunnel junction element (MTJ element 11) having a predetermined pattern by implementing etching treatment on the magnetic film formed on the substrate; a protective film formation step (S18) of forming the protective film 105 (encapsulation film) protecting the magnetic tunnel junction element (MTJ element 11) formed on the substrate; formation steps accompanied by thermal history (S19, S21, S23, and S25) in which a constituent element of the magnetic memory is formed, after the protective film formation step, on the substrate on which the protective film has been formed (S18); and a non-magnetic-field annealing treatment step (at least one or more of S20, S22, S24, and S26) of implementing annealing treatment at the second treatment temperature Tb lower than the first treatment temperature Ta on the substrate in the heat treatment chamber 53 (non-magnetic-field annealing treatment chamber), in vacuum or inert gas, in a state in which no magnetic field is applied.

For example, any one or a plurality among the lower electrode 140, the second interlayer film 2, the upper wiring 15, the sealing portion (resin material 207) for resin-sealing the substrate on which the magnetoresistance effect element (magnetic tunnel junction element) has been formed, and the like can be the constituent element of the magnetic memory in the formation step accompanied by thermal history in which the constituent element of the magnetic memory is formed, after the protective film formation step (S18), on the substrate on which the protective film 105 has been formed.

That is, by implementing the annealing treatment at the second treatment temperature Tb on the substrate (wafer), on which at least the magnetic tunnel junction element (MTJ element 11) and the protective film 105 have been formed, in the non-magnetic-field annealing treatment step, stress and strain of at least the protective film 105 and the magnetic tunnel junction element (MTJ element 11) are relaxed, and the magnetic memory comprising the magnetic tunnel junction element with high element performance, such as thermal stability index, can be easily produced.

Although the basic element performance of the magnetic tunnel junction element (MTJ element 11) is substantially determined in the magnetic-field annealing treatment step (S15), stress and strain of the protective film 105, the MTJ element 11 and the like, which are accumulated in the subsequent lower electrode formation step (S19), step (S21) of forming the second interlayer film 2, upper electrode (upper wiring) formation step (S23), packaging step (S25), and the like, are relaxed by the non-magnetic-field annealing treatment step, thereby making it possible to restore the element performance of the MTJ element 11.

Further, the annealing treatment at the relatively low second treatment temperature Tb in the non-magnetic-field annealing treatment step causes no performance degradation of the magnetic tunnel junction element (MTJ element 11) itself.

In the method for producing a magnetic memory according to the embodiment of the present invention, the formation step accompanied by thermal history has the lower electrode formation step (S19) of implementing the etching treatment on the electrode layer provided on the substrate to form a lower electrode having a predetermined pattern. The non-magnetic-field annealing treatment step (S20) is performed on the substrate subjected to the lower electrode formation step (S19).

That is, even when stress is generated in the protective film 105, the MTJ element 11, and the like after the lower electrode formation step (S19), the stress and strain of the protective film 105, the MTJ element 11, and the like can be easily relaxed by the non-magnetic-field annealing treatment step (S20).

Further, in the method for producing a magnetic memory according to the embodiment of the present invention, the formation step accompanied by thermal history has the interlayer film formation step (S21) of forming the second interlayer film 2. The non-magnetic-field annealing treatment step (S22) is performed on the substrate subjected to the interlayer film formation step (S21) of forming the second interlayer film 2.

That is, even when stress is generated in the protective film 105, the MTJ element 11, and the like after the interlayer film formation step (S21) of forming the second interlayer film 2, the non-magnetic-field annealing treatment step (S22) makes it possible to easily relax the stress and strain of the protective film 105, MTJ element 11, and the like.

Further, in the method for producing a magnetic memory according to the embodiment of the present invention, the formation step accompanied by thermal history has an upper electrode formation step (S23) of forming the upper wiring 15 as an upper electrode adjacent to the magnetic tunnel junction element. The non-magnetic-field annealing treatment step (S24) is performed on the substrate subjected to the upper electrode formation step (S23).

That is, even when stress is generated in the protective film 105, the MTJ element 11, and the like after the step (S23) of forming the upper electrode (upper wiring 15), the non-magnetic-field annealing treatment step (S24) makes it possible to easily relax the stress and strain of the protective film 105, MTJ element 11, and the like.

Further, as described above, when it is difficult to perform heat treatment (non-magnetic-field annealing treatment) of the steps S20, S22, S24, and S26 due to limitations imposed by production cost and the like, by performing the heat treatment step (non-magnetic-field annealing treatment step S24) after the step (S23) of forming the upper electrode (upper wiring 15) at which all the steps of producing the MRAM on the wafer are completed, even without performing the steps S20 and S22, since all the steps of producing the MRAM on the wafer which are accompanied by thermal history are completed before the step (S23) of forming the upper electrode (upper wiring 15), stress and strain of the protective film 105, MTJ element 11, and the like, which have accumulated before the non-magnetic-field annealing treatment step S24, can be relaxed at once.

Further, in the method for producing a magnetic memory according to the embodiment of the present invention, the formation step accompanied by thermal history has a packaging step (S25) of implementing packaging treatment on the chip-shaped substrate including the magnetic tunnel junction element. The non-magnetic-field annealing treatment step (S26) is performed on the chip-shaped substrate subjected to the packaging treatment. Specifically, a step (S25) of resin-sealing the chip-shaped substrate including the magnetic tunnel junction element in a state of bonding to a circuit substrate is performed as the packaging step (S25). The non-magnetic-field annealing treatment step (S26) is performed on the resin-sealed chip-shaped substrate.

That is, even when stress is generated in the protective film 105, the MTJ element 11, and the like after the packaging step (S25), the non-magnetic-field annealing treatment step (S24) makes it possible to easily relax the stress and strain of the protective film 105, MTJ element 11, and the like.

Also, in the method for producing a magnetic memory according to the embodiment of the present invention, a step of naturally cooling or forcibly cooling the annealing treatment object to a room temperature state is performed immediately before the non-magnetic-field annealing treatment step (at least one of steps S20, S22, S24, and S26) (see FIG. 12).

That is, even when stress is generated in the protective film 105, the MTJ element 11, and the like due to cooling to a room temperature state after each formation step, the non-magnetic-field annealing treatment step makes it possible to relax the stress and strain of the protective film 105, MTJ element 11, and the like. In the present embodiment, cooling to the room temperature state is cooling to about 1° C. to 30° C.

Further, in the present embodiment, the first treatment temperature Ta is 380° C. to 420° C., preferably 390° C. to 410° C., and optimally 400° C.

The second treatment temperature Tb, which is lower than the first treatment temperature Ta, is 200° C. or more and less than 400° C., preferably 290° C. to 310° C., and optimally 300° C.

In addition, the first treatment temperature and the second treatment temperature can be appropriately set according to the material, structure and the like of the magnetic film, non-magnetic film and the like.

Although the embodiments of the present invention have been described above in detail with reference to the drawings, specific configurations are not limited to these embodiments, and design changes and the like that do not depart from the gist of the present invention are also included in the present invention.

Further, in the embodiment shown in each of the drawings, it is possible to combine the description contents thereof as long as there is no contradiction or problem in terms of the objective, configuration and the like thereof.

In addition, the description contents of each drawing can constitute an independent embodiment, and the embodiments of the present invention are not limited to one embodiment combining the respective drawings.

The magnetic-field heat treatment chamber 52 with the magnetic field generator turned off may be used as the non-magnetic-field heat treatment chamber 53 (annealing treatment chamber).

Further, the reference layer 111 and the recording layer 113 of the MTJ element 11 may be arranged in reverse order.

In the above-described embodiment, the annealing treatment (heat treatment) of steps S20, S22, S24, and S26 are performed immediately after each of steps S19, S21, S23, and S25 after the steps S11 to S18, but such an embodiment is not limiting.

For example, any one or more annealing treatment (heat treatment) among those of steps S20, S22, S24, and S26 may be performed.

Further, it is not necessary to perform all the steps S19, S21, S23, and S25, and any one or more steps thereamong may be performed as appropriate.

REFERENCE SIGNS LIST

10 Magnetic memory (semiconductor integrated circuit)
11 MTJ element (magnetoresistance effect element, magnetic tunnel junction element)
12 Wafer (substrate)
13 CMOS
14 Intermediate wiring
15 Upper wiring (upper electrode)
18 Bit line
18a Bit line selection circuit
19 Word line
19a Word line selection circuit
20 Sense amplifier
40 Measurement system
41 Measurement means
42 Analysis tool
50 Forming device
52 Magnetic-field heat treatment chamber (magnetic-field annealing treatment chamber)
53 Heat treatment chamber (non-magnetic-field annealing treatment chamber)
54 Control part (control device)
105 Protective film (encapsulation film)
106 Diffusion prevention film
111 Reference layer (first magnetic layer)
112 Barrier layer (non-magnetic layer)
113 Recording layer (second magnetic layer)
140 Lower electrode
141 Via (VIA)
207 Resin material

The invention claimed is:

1. A method for producing a magnetic memory including a magnetic tunnel junction element, the method comprising:
forming a magnetic film in which a non-magnetic layer is disposed between a first magnetic layer and a second magnetic layer on a substrate provided with an electrode layer, and forming a hard mask on the magnetic film;
performing a magnetic field annealing treatment on the substrate at a first treatment temperature in a state where a magnetic field is applied in a direction perpendicular to a film surface of the first magnetic layer or the second magnetic layer in a vacuum;
performing etching treatment on the magnetic film formed on the substrate to form the magnetic tunnel junction element having a pattern;
forming a protective film protecting the magnetic tunnel junction element formed on the substrate, the protective film formed adjacent to a side surface of the magnetic tunnel junction element and the hard mask;
forming a constituent element of the magnetic memory on the substrate, on which the protective film has been formed, and generating a thermal history, after the forming the protective film; and
after generating the thermal history, performing a non-magnetic-field annealing treatment at a second treatment temperature lower than the first treatment temperature on the substrate on which the protective film has been formed in an annealing treatment chamber, in vacuum or inert gas, in a state in which no magnetic field is applied.

2. The method for producing a magnetic memory including a magnetic tunnel junction element according to claim 1, wherein
in the forming the constituent element of the magnetic memory, a lower electrode having a pattern by implementing etching treatment on the electrode layer provided on the substrate is formed, and
the non-magnetic-field annealing treatment is performed on the substrate on which the lower electrode has been formed.

3. The method for producing a magnetic memory including a magnetic tunnel junction element according to claim 1, wherein
in the forming the constituent element of the magnetic memory, an interlayer film is formed, and
the non-magnetic-field annealing treatment is performed on the substrate on which the interlayer film has been formed.

4. The method for producing a magnetic memory including a magnetic tunnel junction element according to claim 1, wherein
in the forming the constituent element of the magnetic memory, an upper electrode adjacent to the magnetic tunnel junction element is formed, and
the non-magnetic-field annealing treatment is performed on the substrate on which the upper electrode has been formed.

5. The method for producing a magnetic memory including a magnetic tunnel junction element according to claim 1, wherein
in the forming the constituent element of the magnetic memory, a packaging treatment on a chip-shaped substrate including the magnetic tunnel junction element is performed, and
the non-magnetic-field annealing treatment is performed on the chip-shaped substrate on which the packaging treatment has been performed.

6. The method for producing a magnetic memory including a magnetic tunnel junction element according to claim 1, wherein immediately before the non-magnetic field annealing treatment is performed, an annealing treatment object is cooled via natural cooling or forced cooling to a room temperature state.

7. The method for producing a magnetic memory including a magnetic tunnel junction element according to claim 1, wherein the second treatment temperature is 200° C. or more and less than 400° C.

8. The method for producing a magnetic memory including a magnetic tunnel junction element according to claim 2, wherein
in the forming the constituent element of the magnetic memory, an interlayer film is formed, and
the non-magnetic-field annealing treatment is performed on the substrate on which the interlayer film has been formed.

9. The method for producing a magnetic memory including a magnetic tunnel junction element according to claim 8, wherein
in the forming the constituent element of the magnetic memory, an upper electrode adjacent to the magnetic tunnel junction element is formed, and
the non-magnetic-field annealing treatment is performed on the substrate on which the upper electrode has been formed.

10. The method for producing a magnetic memory including a magnetic tunnel junction element according to claim 9, wherein
in the forming the constituent element of the magnetic memory, a packaging treatment on a chip-shaped substrate including the magnetic tunnel junction element is performed, and
the non-magnetic-field annealing treatment is performed on the chip-shaped substrate on which the packaging treatment has been performed.

11. The method for producing a magnetic memory including a magnetic tunnel junction element according to claim 10, wherein immediately before the non-magnetic field annealing treatment is performed, an annealing treatment object is cooled via natural cooling or forced cooling to a room temperature state.

12. The method for producing a magnetic memory including a magnetic tunnel junction element according to claim 11, wherein the second treatment temperature is 200° C. or more and less than 400° C.

13. The method for producing a magnetic memory including a magnetic tunnel junction element according to claim 4, wherein immediately before the non-magnetic field annealing treatment is performed, an annealing treatment object is cooled via natural cooling or forced cooling to a room temperature state.

14. The method for producing a magnetic memory including a magnetic tunnel junction element according to claim 13, wherein the second treatment temperature is 200° C. or more and less than 400° C.

15. The method for producing a magnetic memory including a magnetic tunnel junction element according to claim 1, wherein the protective film comprises SiN.

16. A method for producing a magnetic memory including a magnetic tunnel junction element, the method comprising:

forming a magnetic film in which a non-magnetic layer is disposed between a first magnetic layer and a second magnetic layer on a substrate provided with an electrode layer;

performing a magnetic field annealing treatment on the substrate at a first treatment temperature in a state where a magnetic field is applied in a direction perpendicular to a film surface of the first magnetic layer or the second magnetic layer in a vacuum;

performing etching treatment on the magnetic film formed on the substrate to form the magnetic tunnel junction element having a pattern;

forming a protective film protecting the magnetic tunnel junction element formed on the substrate;

forming a constituent element of the magnetic memory on the substrate, on which the protective film has been formed, and generating a thermal history, after the forming the protective film; and after generating the thermal history, performing a non-magnetic-field annealing treatment at a second treatment temperature lower than the first treatment temperature on the substrate on which the protective film has been formed in an annealing treatment chamber, in vacuum or inert gas, in a state in which no magnetic field is applied, wherein the protective film comprises SiN.

* * * * *